(12) United States Patent
Snyder et al.

(10) Patent No.: US 8,062,708 B2
(45) Date of Patent: Nov. 22, 2011

(54) MASKING OF AND MATERIAL CONSTRAINT FOR DEPOSITING BATTERY LAYERS ON FLEXIBLE SUBSTRATES

(75) Inventors: Shawn W. Snyder, Golden, CO (US); Paul C. Brantner, Conifer, CO (US); Henry L. Zoetewey, Englewood, CO (US)

(73) Assignee: Infinite Power Solutions, Inc., Littleton, CO (US)

( * ) Notice: Subject to any disclaimer, the term of this patent is extended or adjusted under 35 U.S.C. 154(b) by 1091 days.

(21) Appl. No.: 11/861,501

(22) Filed: Sep. 26, 2007

(65) Prior Publication Data

US 2008/0078496 A1 Apr. 3, 2008

Related U.S. Application Data

(60) Provisional application No. 60/827,685, filed on Sep. 29, 2006.

(51) Int. Cl.
*B05D 1/32* (2006.01)

(52) U.S. Cl. .......................................... 427/282; 427/272

(58) Field of Classification Search .................. 427/282, 427/272
See application file for complete search history.

(56) References Cited

U.S. PATENT DOCUMENTS

| | | | |
|---|---|---|---|
| 712,316 A | 10/1902 | Loppe et al. | |
| 2,970,180 A | 1/1961 | Urry | |
| 3,616,403 A | 10/1971 | Collins et al. | |
| 3,790,432 A | 2/1974 | Fletcher et al. | |
| 3,797,091 A | 3/1974 | Gavin | |
| 3,850,604 A | 11/1974 | Klein | |
| 3,939,008 A | 2/1976 | Longo et al. | |
| 4,082,569 A | 4/1978 | Evans, Jr. | |
| 4,111,523 A | 9/1978 | Kaminow et al. | |
| 4,127,424 A | 11/1978 | Ullery, Jr. | |
| 4,226,924 A | 10/1980 | Kimura et al. | |
| 4,283,216 A | 8/1981 | Brereton | |
| 4,318,938 A | 3/1982 | Barnett et al. | |
| 4,328,297 A | 5/1982 | Bilhorn | |
| 4,437,966 A | 3/1984 | Hope et al. | |
| 4,442,144 A | 4/1984 | Pipkin | |

(Continued)

FOREIGN PATENT DOCUMENTS

CN 1415124 4/2003

(Continued)

OTHER PUBLICATIONS

Bates et al., "Thin-Film Lithium Batteries," in New Trends in Electrochemical Technology: Energy Storage Systems for Electronics (T. Osaka & M. Datta eds. Gordon and Breach 2000).

(Continued)

*Primary Examiner* — Frederick Parker
(74) *Attorney, Agent, or Firm* — Dewey & LeBoeuf LLP; Jeff E. Schwartz

(57) ABSTRACT

The present invention relates to masking techniques and apparatuses, and in particular, to a method and apparatus for masking a flexible substrate to be coated with one or more material layers. The method involves flexing a substrate to provide a curved surface and providing a flexible sheet on the curved surface to properly apply a coating on the surface of the substrate. The apparatus includes a substrate and a flexible sheet. An elastic material, such as a spring pin, or an off-axis roll-down bar may be used to create the tension used to flex the substrate and or flexible sheet.

18 Claims, 10 Drawing Sheets

U.S. PATENT DOCUMENTS

| | | | |
|---|---|---|---|
| 4,481,265 A | 11/1984 | Ezawa et al. | |
| 4,518,661 A | 5/1985 | Rippere | |
| 4,555,456 A | 11/1985 | Kanehori et al. | |
| 4,572,873 A | 2/1986 | Kanehori et al. | |
| 4,587,225 A | 5/1986 | Tsukuma et al. | |
| 4,619,680 A | 10/1986 | Nourshargh et al. | |
| 4,645,726 A | 2/1987 | Hiratani et al. | |
| 4,664,993 A | 5/1987 | Sturgis et al. | |
| 4,668,593 A | 5/1987 | Sammells | |
| RE32,449 E | 6/1987 | Claussen | |
| 4,672,586 A | 6/1987 | Shimohigashi et al. | |
| 4,710,940 A | 12/1987 | Sipes, Jr. | |
| 4,728,588 A | 3/1988 | Noding et al. | |
| 4,740,431 A | 4/1988 | Little | |
| 4,756,717 A | 7/1988 | Sturgis et al. | |
| 4,785,459 A | 11/1988 | Baer | |
| 4,826,743 A | 5/1989 | Nazri | |
| 4,865,428 A | 9/1989 | Corrigan | |
| 4,878,094 A | 10/1989 | Balkanski | |
| 4,903,326 A | 2/1990 | Zakman et al. | |
| 4,915,810 A | 4/1990 | Kestigian et al. | |
| 4,964,877 A | 10/1990 | Keister et al. | |
| 4,977,007 A | 12/1990 | Kondo et al. | |
| 4,978,437 A | 12/1990 | Wirz | |
| 5,006,737 A | 4/1991 | Fay | |
| 5,019,467 A | 5/1991 | Fujiwara | |
| 5,030,331 A | 7/1991 | Sato | |
| 5,035,965 A | 7/1991 | Sangyoji et al. | |
| 5,055,704 A | 10/1991 | Link et al. | |
| 5,057,385 A | 10/1991 | Hope et al. | |
| 5,085,904 A | 2/1992 | Deak et al. | |
| 5,096,852 A | 3/1992 | Hobson | |
| 5,100,821 A | 3/1992 | Fay | |
| 5,107,538 A | 4/1992 | Benton et al. | |
| 5,110,694 A | 5/1992 | Nagasubramanian et al. | |
| 5,110,696 A | 5/1992 | Shokoohi et al. | |
| 5,119,269 A | 6/1992 | Nakayama | |
| 5,119,460 A | 6/1992 | Bruce et al. | |
| 5,124,782 A | 6/1992 | Hundt et al. | |
| 5,147,985 A | 9/1992 | DuBrucq | |
| 5,153,710 A | 10/1992 | McCain | |
| 5,169,408 A | 12/1992 | Biggerstaff et al. | |
| 5,171,413 A | 12/1992 | Arntz et al. | |
| 5,173,271 A | 12/1992 | Chen et al. | |
| 5,174,876 A | 12/1992 | Buchal et al. | |
| 5,180,645 A | 1/1993 | Moré | |
| 5,187,564 A | 2/1993 | McCain | |
| 5,196,041 A | 3/1993 | Tumminelli et al. | |
| 5,196,374 A | 3/1993 | Hundt et al. | |
| 5,200,029 A | 4/1993 | Bruce et al. | |
| 5,202,201 A | 4/1993 | Meunier et al. | |
| 5,206,925 A | 4/1993 | Nakazawa et al. | |
| 5,208,121 A | 5/1993 | Yahnke et al. | |
| 5,217,828 A | 6/1993 | Sangyoji et al. | |
| 5,221,891 A | 6/1993 | Janda et al. | |
| 5,225,288 A | 7/1993 | Beeson et al. | |
| 5,227,264 A | 7/1993 | Duval et al. | |
| 5,237,439 A | 8/1993 | Misono et al. | |
| 5,252,194 A | 10/1993 | Demaray et al. | |
| 5,262,254 A | 11/1993 | Koksbang et al. | |
| 5,273,608 A | 12/1993 | Nath | |
| 5,287,427 A | 2/1994 | Atkins et al. | |
| 5,296,089 A | 3/1994 | Chen et al. | |
| 5,300,461 A | 4/1994 | Ting | |
| 5,303,319 A | 4/1994 | Ford et al. | |
| 5,306,569 A | 4/1994 | Hiraki | |
| 5,307,240 A | 4/1994 | McMahon | |
| 5,309,302 A | 5/1994 | Vollmann | |
| 5,314,765 A | 5/1994 | Bates | |
| 5,326,652 A | 7/1994 | Lake | |
| 5,326,653 A | 7/1994 | Chang | |
| 5,338,624 A | 8/1994 | Gruenstern et al. | |
| 5,338,625 A | 8/1994 | Bates et al. | |
| 5,342,709 A | 8/1994 | Yahnke et al. | |
| 5,355,089 A | 10/1994 | Treger | |
| 5,360,686 A | 11/1994 | Peled et al. | |
| 5,362,579 A | 11/1994 | Rossoll et al. | |
| 5,381,262 A | 1/1995 | Arima et al. | |
| 5,387,482 A | 2/1995 | Anani | |
| 5,401,595 A | 3/1995 | Kagawa et al. | |
| 5,403,680 A | 4/1995 | Otagawa et al. | |
| 5,411,537 A | 5/1995 | Munshi et al. | |
| 5,411,592 A | 5/1995 | Ovshinsky et al. | |
| 5,419,982 A | 5/1995 | Tura et al. | |
| 5,427,669 A | 6/1995 | Drummond | |
| 5,435,826 A | 7/1995 | Sakakibara et al. | |
| 5,437,692 A | 8/1995 | Dasgupta et al. | |
| 5,445,856 A | 8/1995 | Chaloner-Gill | |
| 5,445,906 A | 8/1995 | Hobson et al. | |
| 5,448,110 A | 9/1995 | Tuttle et al. | |
| 5,449,576 A | 9/1995 | Anani | |
| 5,455,126 A | 10/1995 | Bates et al. | |
| 5,457,569 A | 10/1995 | Liou et al. | |
| 5,458,995 A | 10/1995 | Behl et al. | |
| 5,464,692 A * | 11/1995 | Huber | 428/343 |
| 5,464,706 A | 11/1995 | Dasgupta et al. | |
| 5,470,396 A | 11/1995 | Mongon et al. | |
| 5,472,795 A | 12/1995 | Atita | |
| 5,475,528 A | 12/1995 | LaBorde | |
| 5,478,456 A | 12/1995 | Humpal et al. | |
| 5,483,613 A | 1/1996 | Bruce et al. | |
| 5,493,177 A | 2/1996 | Muller et al. | |
| 5,498,489 A | 3/1996 | Dasgupta et al. | |
| 5,499,207 A | 3/1996 | Miki et al. | |
| 5,501,918 A | 3/1996 | Gruenstern et al. | |
| 5,504,041 A | 4/1996 | Summerfelt | |
| 5,512,147 A | 4/1996 | Bates et al. | |
| 5,512,387 A | 4/1996 | Ovshinsky | |
| 5,512,389 A | 4/1996 | Dasgupta et al. | |
| 5,538,796 A | 7/1996 | Schaffer et al. | |
| 5,540,742 A | 7/1996 | Sangyoji et al. | |
| 5,547,780 A | 8/1996 | Kagawa et al. | |
| 5,547,782 A | 8/1996 | Dasgupta et al. | |
| 5,552,242 A | 9/1996 | Ovshinsky et al. | |
| 5,555,127 A | 9/1996 | Abdelkader et al. | |
| 5,561,004 A | 10/1996 | Bates et al. | |
| 5,563,979 A | 10/1996 | Bruce et al. | |
| 5,565,071 A | 10/1996 | Demaray et al. | |
| 5,567,210 A | 10/1996 | Bates et al. | |
| 5,582,935 A | 12/1996 | Dasgupta et al. | |
| 5,591,520 A | 1/1997 | Migliorini et al. | |
| 5,597,660 A | 1/1997 | Bates et al. | |
| 5,597,661 A | 1/1997 | Takeuchi et al. | |
| 5,599,355 A | 2/1997 | Nagasubramanian et al. | |
| 5,601,952 A | 2/1997 | Dasgupta et al. | |
| 5,603,816 A | 2/1997 | Demaray et al. | |
| 5,607,560 A | 3/1997 | Hirabayashi et al. | |
| 5,607,789 A | 3/1997 | Treger et al. | |
| 5,612,152 A | 3/1997 | Bates et al. | |
| 5,613,995 A | 3/1997 | Bhandarkar et al. | |
| 5,616,933 A | 4/1997 | Li | |
| 5,637,418 A | 6/1997 | Brown et al. | |
| 5,643,480 A | 7/1997 | Gustavsson et al. | |
| 5,644,207 A | 7/1997 | Lew et al. | |
| 5,645,626 A | 7/1997 | Edlund et al. | |
| 5,645,960 A | 7/1997 | Scrosati et al. | |
| 5,654,054 A | 8/1997 | Tropsha et al. | |
| 5,654,984 A | 8/1997 | Hershbarger et al. | |
| 5,658,652 A | 8/1997 | Sellergren | |
| 5,660,700 A | 8/1997 | Shimizu et al. | |
| 5,665,490 A | 9/1997 | Takeuchi et al. | |
| 5,667,538 A | 9/1997 | Bailey | |
| 5,677,784 A | 10/1997 | Harris | |
| 5,679,980 A | 10/1997 | Summerfelt | |
| 5,681,666 A | 10/1997 | Treger et al. | |
| 5,686,360 A | 11/1997 | Harvey, III et al. | |
| 5,689,522 A | 11/1997 | Beach | |
| 5,693,956 A | 12/1997 | Shi et al. | |
| 5,702,829 A | 12/1997 | Paidassi et al. | |
| 5,705,293 A | 1/1998 | Hobson | |
| 5,718,813 A | 2/1998 | Drummond et al. | |
| 5,719,976 A | 2/1998 | Henry et al. | |
| 5,721,067 A | 2/1998 | Jacobs et al. | |
| RE35,746 E | 3/1998 | Lake | |
| 5,731,661 A | 3/1998 | So et al. | |
| 5,738,731 A | 4/1998 | Shindo et al. | |
| 5,742,094 A | 4/1998 | Ting | |

| | | | | | |
|---|---|---|---|---|---|
| 5,755,938 A | 5/1998 | Fukui et al. | 6,077,106 A | 6/2000 | Mish |
| 5,755,940 A | 5/1998 | Shindo | 6,077,642 A | 6/2000 | Ogata et al. |
| 5,757,126 A | 5/1998 | Harvey, III et al. | 6,078,791 A | 6/2000 | Tuttle et al. |
| 5,762,768 A | 6/1998 | Goy et al. | 6,080,508 A | 6/2000 | Dasgupta et al. |
| 5,763,058 A | 6/1998 | Isen et al. | 6,080,643 A | 6/2000 | Noguchi et al. |
| 5,771,562 A | 6/1998 | Harvey, III et al. | 6,093,944 A | 7/2000 | VanDover |
| 5,776,278 A | 7/1998 | Tuttle et al. | 6,094,292 A | 7/2000 | Goldner et al. |
| 5,779,839 A | 7/1998 | Tuttle et al. | 6,096,569 A | 8/2000 | Matsuno et al. |
| 5,790,489 A | 8/1998 | O'Connor | 6,100,108 A | 8/2000 | Mizuno et al. |
| 5,792,550 A | 8/1998 | Phillips et al. | 6,106,933 A | 8/2000 | Nagai et al. |
| 5,805,223 A | 9/1998 | Shikakura et al. | 6,110,531 A | 8/2000 | Paz De Araujo |
| 5,811,177 A | 9/1998 | Shi et al. | 6,115,616 A | 9/2000 | Halperin et al. |
| 5,814,195 A | 9/1998 | Lehan et al. | 6,117,279 A | 9/2000 | Smolanoff et al. |
| 5,830,330 A | 11/1998 | Lantsman | 6,118,426 A | 9/2000 | Albert et al. |
| 5,831,262 A | 11/1998 | Greywall et al. | 6,120,890 A | 9/2000 | Chen et al. |
| 5,834,137 A | 11/1998 | Zhang et al. | 6,129,277 A | 10/2000 | Grant et al. |
| 5,841,931 A | 11/1998 | Foresi et al. | 6,133,670 A | 10/2000 | Rodgers et al. |
| 5,842,118 A | 11/1998 | Wood, Jr. | 6,137,671 A | 10/2000 | Staffiere |
| 5,845,990 A | 12/1998 | Hymer | 6,144,916 A | 11/2000 | Wood, Jr. et al. |
| 5,847,865 A | 12/1998 | Gopinath et al. | 6,146,225 A | 11/2000 | Sheats et al. |
| 5,849,163 A | 12/1998 | Ichikawa et al. | 6,148,503 A | 11/2000 | Delnick et al. |
| 5,851,896 A | 12/1998 | Summerfelt | 6,156,452 A | 12/2000 | Kozuki et al. |
| 5,853,830 A | 12/1998 | McCaulley et al. | 6,157,765 A | 12/2000 | Bruce et al. |
| 5,855,744 A | 1/1999 | Halsey et al. | 6,159,635 A | 12/2000 | Dasgupta et al. |
| 5,856,705 A | 1/1999 | Ting | 6,160,373 A | 12/2000 | Dunn et al. |
| 5,864,182 A | 1/1999 | Matsuzaki | 6,162,709 A | 12/2000 | Raoux et al. |
| 5,865,860 A | 2/1999 | Delnick | 6,165,566 A | 12/2000 | Tropsha |
| 5,870,273 A | 2/1999 | Sogabe et al. | 6,168,884 B1 | 1/2001 | Neudecker et al. |
| 5,874,184 A | 2/1999 | Takeuchi et al. | 6,169,474 B1 | 1/2001 | Greeff et al. |
| 5,882,721 A | 3/1999 | Delnick | 6,175,075 B1 | 1/2001 | Shiotsuka et al. |
| 5,882,946 A | 3/1999 | Otani | 6,176,986 B1 | 1/2001 | Watanabe et al. |
| 5,889,383 A | 3/1999 | Teich | 6,181,283 B1 | 1/2001 | Johnson et al. |
| 5,895,731 A | 4/1999 | Clingempeel | 6,192,222 B1 | 2/2001 | Greeff et al. |
| 5,897,522 A | 4/1999 | Nitzan | 6,197,167 B1 | 3/2001 | Tanaka |
| 5,900,057 A | 5/1999 | Buchal et al. | 6,198,217 B1 | 3/2001 | Suzuki et al. |
| 5,909,346 A | 6/1999 | Malhotra et al. | 6,204,111 B1 | 3/2001 | Uemoto et al. |
| 5,916,704 A | 6/1999 | Lewin et al. | 6,210,544 B1 | 4/2001 | Sasaki |
| 5,923,964 A | 7/1999 | Li | 6,210,832 B1 | 4/2001 | Visco et al. |
| 5,930,046 A | 7/1999 | Solberg et al. | 6,214,061 B1 | 4/2001 | Visco et al. |
| 5,930,584 A | 7/1999 | Sun et al. | 6,214,660 B1 | 4/2001 | Uemoto et al. |
| 5,942,089 A | 8/1999 | Sproul et al. | 6,218,049 B1 | 4/2001 | Bates et al. |
| 5,948,215 A | 9/1999 | Lantsman | 6,220,516 B1 | 4/2001 | Tuttle et al. |
| 5,948,464 A | 9/1999 | Delnick | 6,223,317 B1 | 4/2001 | Pax et al. |
| 5,948,562 A | 9/1999 | Fulcher et al. | 6,228,532 B1 | 5/2001 | Tsuji et al. |
| 5,952,778 A | 9/1999 | Haskal et al. | 6,229,987 B1 | 5/2001 | Greeff et al. |
| 5,955,217 A | 9/1999 | Van Lerberghe | 6,232,242 B1 | 5/2001 | Hata et al. |
| 5,961,672 A | 10/1999 | Skotheim et al. | 6,235,432 B1 | 5/2001 | Kono et al. |
| 5,961,682 A | 10/1999 | Lee et al. | 6,236,793 B1 | 5/2001 | Lawrence et al. |
| 5,966,491 A | 10/1999 | DiGiovanni | 6,242,129 B1 | 6/2001 | Johnson |
| 5,970,393 A | 10/1999 | Khorrami et al. | 6,242,132 B1 | 6/2001 | Neudecker et al. |
| 5,973,913 A | 10/1999 | McEwen et al. | 6,248,291 B1 | 6/2001 | Nakagama et al. |
| 5,977,582 A | 11/1999 | Flemming et al. | 6,248,481 B1 | 6/2001 | Visco et al. |
| 5,982,144 A | 11/1999 | Johnson et al. | 6,248,640 B1 | 6/2001 | Nam |
| 5,985,484 A | 11/1999 | Young et al. | 6,249,222 B1 | 6/2001 | Gehlot |
| 5,985,485 A | 11/1999 | Ovshinsky et al. | 6,252,564 B1 | 6/2001 | Albert et al. |
| 6,000,603 A | 12/1999 | Koskenmaki et al. | 6,258,252 B1 | 7/2001 | Miyasaka et al. |
| 6,001,224 A | 12/1999 | Drummond et al. | 6,261,917 B1 | 7/2001 | Quek et al. |
| 6,004,660 A | 12/1999 | Topolski et al. | 6,264,709 B1 | 7/2001 | Yoon et al. |
| 6,007,945 A | 12/1999 | Jacobs et al. | 6,265,652 B1 | 7/2001 | Kurata et al. |
| 6,013,949 A | 1/2000 | Tuttle | 6,268,695 B1 | 7/2001 | Affinito |
| 6,019,284 A | 2/2000 | Freeman et al. | 6,271,053 B1 | 8/2001 | Kondo |
| 6,023,610 A | 2/2000 | Wood, Jr. | 6,271,793 B1 | 8/2001 | Brady et al. |
| 6,024,844 A | 2/2000 | Drummond et al. | 6,271,801 B2 | 8/2001 | Tuttle et al. |
| 6,025,094 A | 2/2000 | Visco et al. | 6,280,585 B1 | 8/2001 | Obinata |
| 6,028,990 A | 2/2000 | Shahani et al. | 6,280,875 B1 | 8/2001 | Kwak et al. |
| 6,030,421 A | 2/2000 | Gauthier et al. | 6,281,142 B1 | 8/2001 | Basceri |
| 6,042,965 A | 3/2000 | Nestler et al. | 6,284,406 B1 | 9/2001 | Xing et al. |
| 6,045,626 A | 4/2000 | Yano et al. | 6,287,986 B1 | 9/2001 | Mihara |
| 6,045,652 A | 4/2000 | Tuttle et al. | 6,289,209 B1 | 9/2001 | Wood, Jr. |
| 6,045,942 A | 4/2000 | Miekka et al. | 6,290,821 B1 | 9/2001 | McLeod |
| 6,046,081 A | 4/2000 | Kuo | 6,290,822 B1 | 9/2001 | Fleming et al. |
| 6,048,372 A | 4/2000 | Mangahara et al. | 6,291,098 B1 | 9/2001 | Shibuya et al. |
| 6,051,114 A | 4/2000 | Yao et al. | 6,294,722 B1 | 9/2001 | Kondo et al. |
| 6,051,296 A | 4/2000 | McCaulley et al. | 6,296,949 B1 | 10/2001 | Bergstresser et al. |
| 6,052,397 A | 4/2000 | Jeon et al. | 6,296,967 B1 | 10/2001 | Jacobs et al. |
| 6,057,557 A | 5/2000 | Ichikawa | 6,296,971 B1 | 10/2001 | Hara |
| 6,058,233 A | 5/2000 | Dragone | 6,300,215 B1 | 10/2001 | Shin |
| 6,071,323 A | 6/2000 | Kawaguchi | 6,302,939 B1 | 10/2001 | Rabin |
| 6,075,973 A | 6/2000 | Greeff et al. | 6,306,265 B1 | 10/2001 | Fu et al. |

| | | |
|---|---|---|
| 6,316,563 B2 | 11/2001 | Naijo et al. |
| 6,323,416 B1 | 11/2001 | Komori et al. |
| 6,324,211 B1 | 11/2001 | Ovard et al. |
| 6,325,294 B2 | 12/2001 | Tuttle et al. |
| 6,329,213 B1 | 12/2001 | Tuttle et al. |
| 6,339,236 B1 | 1/2002 | Tomii et al. |
| 6,344,366 B1 | 2/2002 | Bates |
| 6,344,419 B1 | 2/2002 | Forster et al. |
| 6,344,795 B1 | 2/2002 | Gehlot |
| 6,350,353 B2 | 2/2002 | Gopalraja et al. |
| 6,351,630 B2 | 2/2002 | Wood, Jr. |
| 6,356,230 B1 | 3/2002 | Greef et al. |
| 6,356,694 B1 | 3/2002 | Weber |
| 6,356,764 B1 | 3/2002 | Ovard et al. |
| 6,358,810 B1 | 3/2002 | Dornfest et al. |
| 6,360,954 B1 | 3/2002 | Barnardo |
| 6,361,662 B1 | 3/2002 | Chiba et al. |
| 6,365,300 B1 | 4/2002 | Ota et al. |
| 6,365,319 B1 | 4/2002 | Heath et al. |
| 6,368,275 B1 | 4/2002 | Sliwa et al. |
| 6,369,316 B1 | 4/2002 | Plessing et al. |
| 6,372,383 B1 | 4/2002 | Lee et al. |
| 6,372,386 B1 | 4/2002 | Cho et al. |
| 6,373,224 B1 | 4/2002 | Goto et al. |
| 6,375,780 B1 | 4/2002 | Tuttle et al. |
| 6,376,027 B1 | 4/2002 | Lee et al. |
| 6,379,835 B1 | 4/2002 | Kucherovsky et al. |
| 6,379,842 B1 | 4/2002 | Mayer |
| 6,379,846 B1 | 4/2002 | Terahara et al. |
| 6,380,477 B1 | 4/2002 | Curtin |
| 6,384,573 B1 | 5/2002 | Dunn |
| 6,387,563 B1 | 5/2002 | Bates |
| 6,391,166 B1 | 5/2002 | Wang |
| 6,392,565 B1 | 5/2002 | Brown |
| 6,394,598 B1 | 5/2002 | Kaiser |
| 6,395,430 B1 | 5/2002 | Cho et al. |
| 6,396,001 B1 | 5/2002 | Nakamura |
| 6,398,824 B1 | 6/2002 | Johnson |
| 6,399,241 B1 | 6/2002 | Hara et al. |
| 6,402,039 B1 | 6/2002 | Freeman et al. |
| 6,402,795 B1 | 6/2002 | Chu et al. |
| 6,402,796 B1 | 6/2002 | Johnson |
| 6,409,965 B1 | 6/2002 | Nagata et al. |
| 6,413,284 B1 | 7/2002 | Chu et al. |
| 6,413,285 B1 | 7/2002 | Chu et al. |
| 6,413,382 B1 | 7/2002 | Wang et al. |
| 6,413,645 B1 | 7/2002 | Graff et al. |
| 6,413,676 B1 | 7/2002 | Munshi |
| 6,414,626 B1 | 7/2002 | Greef et al. |
| 6,416,598 B1 | 7/2002 | Sircar |
| 6,420,961 B1 | 7/2002 | Bates et al. |
| 6,422,698 B2 | 7/2002 | Kaiser |
| 6,423,106 B1 | 7/2002 | Bates |
| 6,423,776 B1 | 7/2002 | Akkapeddi et al. |
| 6,426,163 B1 | 7/2002 | Pasquier et al. |
| 6,432,577 B1 | 8/2002 | Shul et al. |
| 6,432,584 B1 | 8/2002 | Visco et al. |
| 6,433,380 B2 | 8/2002 | Shin |
| 6,433,465 B1 | 8/2002 | McKnight et al. |
| 6,436,156 B1 | 8/2002 | Wandeloski et al. |
| 6,437,231 B2 | 8/2002 | Kurata et al. |
| 6,444,336 B1 | 9/2002 | Jia et al. |
| 6,444,355 B1 | 9/2002 | Murai et al. |
| 6,444,368 B1 | 9/2002 | Hikmet et al. |
| 6,444,750 B1 | 9/2002 | Touhsaent |
| 6,459,418 B1 | 10/2002 | Comiskey et al. |
| 6,459,726 B1 | 10/2002 | Ovard et al. |
| 6,466,771 B2 | 10/2002 | Wood, Jr. |
| 6,475,668 B1 | 11/2002 | Hosokawa et al. |
| 6,481,623 B1 | 11/2002 | Grant et al. |
| 6,488,822 B1 | 12/2002 | Moslehi |
| 6,494,999 B1 | 12/2002 | Herrera et al. |
| 6,495,283 B1 | 12/2002 | Yoon et al. |
| 6,497,598 B2 | 12/2002 | Affinito |
| 6,500,287 B1 | 12/2002 | Azens et al. |
| 6,503,661 B1 | 1/2003 | Park et al. |
| 6,503,831 B2 | 1/2003 | Speakman |
| 6,506,289 B2 | 1/2003 | Demaray et al. |
| 6,511,516 B1 | 1/2003 | Johnson et al. |
| 6,511,615 B1 | 1/2003 | Dawes et al. |
| 6,517,968 B2 | 2/2003 | Johnson et al. |
| 6,522,067 B1 | 2/2003 | Graff et al. |
| 6,524,466 B1 | 2/2003 | Bonaventura et al. |
| 6,524,750 B1 | 2/2003 | Mansuetto |
| 6,525,976 B1 | 2/2003 | Johnson |
| 6,528,212 B1 | 3/2003 | Kusumoto et al. |
| 6,533,907 B2 | 3/2003 | Demaray et al. |
| 6,537,428 B1 | 3/2003 | Xiong et al. |
| 6,538,211 B2 | 3/2003 | St. Lawrence et al. |
| 6,541,147 B1 | 4/2003 | McLean et al. |
| 6,548,912 B1 | 4/2003 | Graff et al. |
| 6,551,745 B2 | 4/2003 | Moutsios et al. |
| 6,558,836 B1 | 5/2003 | Whitacre et al. |
| 6,562,513 B1 | 5/2003 | Takeuchi et al. |
| 6,563,998 B1 | 5/2003 | Farah et al. |
| 6,569,564 B1 | 5/2003 | Lane |
| 6,569,570 B2 | 5/2003 | Sonobe et al. |
| 6,570,325 B2 | 5/2003 | Graff et al. |
| 6,572,173 B2 | 6/2003 | Muller |
| 6,573,652 B1 | 6/2003 | Graff et al. |
| 6,576,546 B2 | 6/2003 | Gilbert et al. |
| 6,579,728 B2 | 6/2003 | Grant et al. |
| 6,582,480 B2 | 6/2003 | Pasquier et al. |
| 6,582,481 B1 | 6/2003 | Erbil |
| 6,582,852 B1 | 6/2003 | Gao et al. |
| 6,589,299 B2 | 7/2003 | Missling et al. |
| 6,593,150 B2 | 7/2003 | Ramberg et al. |
| 6,599,662 B1 | 7/2003 | Chiang et al. |
| 6,600,905 B2 | 7/2003 | Greeff et al. |
| 6,602,338 B2 | 8/2003 | Chen et al. |
| 6,603,139 B1 | 8/2003 | Tessler et al. |
| 6,603,391 B1 | 8/2003 | Greeff et al. |
| 6,605,228 B1 | 8/2003 | Kawaguchi et al. |
| 6,608,464 B1 | 8/2003 | Lew et al. |
| 6,610,440 B1 | 8/2003 | LaFollette et al. |
| 6,615,614 B1 | 9/2003 | Makikawa et al. |
| 6,616,035 B2 | 9/2003 | Ehrensvard et al. |
| 6,618,829 B2 | 9/2003 | Pax et al. |
| 6,620,545 B2 | 9/2003 | Goenka et al. |
| 6,622,049 B2 | 9/2003 | Penner et al. |
| 6,632,563 B1 | 10/2003 | Krasnov et al. |
| 6,637,906 B2 | 10/2003 | Knoerzer et al. |
| 6,637,916 B2 | 10/2003 | Mullner |
| 6,639,578 B1 | 10/2003 | Comiskey et al. |
| 6,645,675 B1 | 11/2003 | Munshi |
| 6,650,000 B2 | 11/2003 | Ballantine et al. |
| 6,650,942 B2 | 11/2003 | Howard et al. |
| 6,662,430 B2 | 12/2003 | Brady et al. |
| 6,664,006 B1 | 12/2003 | Munshi |
| 6,673,484 B2 | 1/2004 | Matsuura |
| 6,673,716 B1 | 1/2004 | D'Couto et al. |
| 6,674,159 B1 | 1/2004 | Peterson et al. |
| 6,677,070 B2 | 1/2004 | Kearl |
| 6,683,244 B2 | 1/2004 | Fujimori et al. |
| 6,683,749 B2 | 1/2004 | Daby et al. |
| 6,686,096 B1 | 2/2004 | Chung |
| 6,693,840 B2 | 2/2004 | Shimada et al. |
| 6,700,491 B2 | 3/2004 | Shafer |
| 6,706,449 B2 | 3/2004 | Mikhaylik et al. |
| 6,709,778 B2 | 3/2004 | Johnson |
| 6,713,216 B2 | 3/2004 | Kugai et al. |
| 6,713,389 B2 | 3/2004 | Speakman |
| 6,713,987 B2 | 3/2004 | Krasnov et al. |
| 6,723,140 B2 | 4/2004 | Chu et al. |
| 6,730,423 B2 | 5/2004 | Einhart et al. |
| 6,733,924 B1 | 5/2004 | Skotheim et al. |
| 6,737,197 B2 | 5/2004 | Chu et al. |
| 6,737,789 B2 | 5/2004 | Radziemski et al. |
| 6,741,178 B1 | 5/2004 | Tuttle |
| 6,750,156 B2 | 6/2004 | Le et al. |
| 6,752,842 B2 | 6/2004 | Luski et al. |
| 6,753,108 B1 | 6/2004 | Hampden-Smith et al. |
| 6,753,114 B2 | 6/2004 | Jacobs et al. |
| 6,760,520 B1 | 7/2004 | Medin et al. |
| 6,764,525 B1 | 7/2004 | Whitacre et al. |
| 6,768,246 B2 | 7/2004 | Pelrine et al. |
| 6,768,855 B1 | 7/2004 | Bakke et al. |
| 6,770,176 B2 | 8/2004 | Benson et al. |

| | | |
|---|---|---|
| 6,773,848 B1 | 8/2004 | Nortoft et al. |
| 6,780,208 B2 | 8/2004 | Hopkins et al. |
| 6,797,428 B1 | 9/2004 | Skotheim et al. |
| 6,797,429 B1 | 9/2004 | Komatsu |
| 6,805,998 B2 | 10/2004 | Jenson et al. |
| 6,805,999 B2 | 10/2004 | Lee et al. |
| 6,818,356 B1 | 11/2004 | Bates |
| 6,822,157 B2 | 11/2004 | Fujioka |
| 6,824,922 B2 | 11/2004 | Park et al. |
| 6,827,826 B2 | 12/2004 | Demaray et al. |
| 6,828,063 B2 | 12/2004 | Park et al. |
| 6,828,065 B2 | 12/2004 | Munshi |
| 6,830,846 B2 | 12/2004 | Kramlich et al. |
| 6,835,493 B2 | 12/2004 | Zhang et al. |
| 6,838,209 B2 | 1/2005 | Langan et al. |
| 6,846,765 B2 | 1/2005 | Imamura et al. |
| 6,852,139 B2 | 2/2005 | Zhang et al. |
| 6,855,441 B1 | 2/2005 | Levanon |
| 6,861,821 B2 | 3/2005 | Masumoto et al. |
| 6,863,699 B1 | 3/2005 | Krasnov et al. |
| 6,866,901 B2 | 3/2005 | Burrows et al. |
| 6,866,963 B2 | 3/2005 | Seung et al. |
| 6,869,722 B2 | 3/2005 | Kearl |
| 6,884,327 B2 | 4/2005 | Pan et al. |
| 6,886,240 B2 | 5/2005 | Zhang et al. |
| 6,890,385 B2 * | 5/2005 | Tsuchiya et al. ............... 118/505 |
| 6,896,992 B2 | 5/2005 | Kearl |
| 6,899,975 B2 | 5/2005 | Watanabe et al. |
| 6,902,660 B2 | 6/2005 | Lee et al. |
| 6,905,578 B1 | 6/2005 | Moslehi et al. |
| 6,906,436 B2 | 6/2005 | Jenson et al. |
| 6,911,667 B2 | 6/2005 | Pichler et al. |
| 6,916,679 B2 | 7/2005 | Snyder et al. |
| 6,921,464 B2 | 7/2005 | Krasnov et al. |
| 6,923,702 B2 | 8/2005 | Graff et al. |
| 6,924,164 B2 | 8/2005 | Jenson |
| 6,929,879 B2 | 8/2005 | Yamazaki |
| 6,936,377 B2 | 8/2005 | Wensley et al. |
| 6,936,381 B2 | 8/2005 | Skotheim et al. |
| 6,936,407 B2 | 8/2005 | Pichler |
| 6,949,389 B2 | 9/2005 | Pichler et al. |
| 6,955,986 B2 | 10/2005 | Li |
| 6,962,613 B2 | 11/2005 | Jenson |
| 6,962,671 B2 | 11/2005 | Martin et al. |
| 6,964,829 B2 | 11/2005 | Utsugi et al. |
| 6,982,132 B1 | 1/2006 | Goldner et al. |
| 6,986,965 B2 | 1/2006 | Jenson et al. |
| 6,994,933 B1 | 2/2006 | Bates |
| 7,022,431 B2 | 4/2006 | Shchori et al. |
| 7,033,406 B2 | 4/2006 | Weir et al. |
| 7,045,246 B2 | 5/2006 | Simburger et al. |
| 7,045,372 B2 | 5/2006 | Ballantine et al. |
| 7,056,620 B2 | 6/2006 | Krasnov et al. |
| 7,073,723 B2 | 7/2006 | Fürst et al. |
| 7,095,372 B2 | 8/2006 | Soler Castany et al. |
| 7,129,166 B2 | 10/2006 | Speakman |
| 7,131,189 B2 | 11/2006 | Jenson |
| 7,144,654 B2 | 12/2006 | LaFollette et al. |
| 7,144,655 B2 | 12/2006 | Jenson et al. |
| 7,157,187 B2 | 1/2007 | Jenson |
| 7,158,031 B2 | 1/2007 | Tuttle |
| 7,162,392 B2 | 1/2007 | Vock et al. |
| 7,183,693 B2 | 2/2007 | Brantner et al. |
| 7,186,479 B2 | 3/2007 | Krasnov et al. |
| 7,194,801 B2 | 3/2007 | Jenson et al. |
| 7,198,832 B2 | 4/2007 | Burrows et al. |
| 7,202,825 B2 | 4/2007 | Leizerovich et al. |
| 7,220,517 B2 | 5/2007 | Park et al. |
| 7,230,321 B2 | 6/2007 | McCain |
| 7,247,408 B2 | 7/2007 | Skotheim et al. |
| 7,253,494 B2 | 8/2007 | Mino et al. |
| 7,265,674 B2 | 9/2007 | Tuttle |
| 7,267,904 B2 | 9/2007 | Komatsu et al. |
| 7,267,906 B2 | 9/2007 | Mizuta et al. |
| 7,273,682 B2 | 9/2007 | Park et al. |
| 7,274,118 B2 | 9/2007 | Jenson et al. |
| 7,288,340 B2 | 10/2007 | Iwamoto |
| 7,316,867 B2 | 1/2008 | Park et al. |
| 7,323,634 B2 | 1/2008 | Speakman |
| 7,332,363 B2 | 2/2008 | Edwards |
| 7,335,441 B2 | 2/2008 | Luski et al. |
| RE40,137 E | 3/2008 | Tuttle et al. |
| 7,345,647 B1 | 3/2008 | Rodenbeck |
| 7,348,099 B2 | 3/2008 | Mukai et al. |
| 7,389,580 B2 | 6/2008 | Jenson et al. |
| 7,400,253 B2 | 7/2008 | Cohen |
| 7,410,730 B2 | 8/2008 | Bates |
| RE40,531 E | 10/2008 | Graff et al. |
| 7,468,221 B2 | 12/2008 | LaFollette et al. |
| 7,494,742 B2 | 2/2009 | Tarnowski et al. |
| 7,670,724 B1 | 3/2010 | Chan et al. |
| 2001/0005561 A1 | 6/2001 | Yamada et al. |
| 2001/0027159 A1 | 10/2001 | Kaneyoshi |
| 2001/0031122 A1 | 10/2001 | Lackritz et al. |
| 2001/0032666 A1 | 10/2001 | Jenson et al. |
| 2001/0033952 A1 | 10/2001 | Jenson et al. |
| 2001/0034106 A1 | 10/2001 | Moise et al. |
| 2001/0041294 A1 | 11/2001 | Chu et al. |
| 2001/0041460 A1 | 11/2001 | Wiggins |
| 2001/0052752 A1 | 12/2001 | Ghosh et al. |
| 2001/0054437 A1 | 12/2001 | Komori et al. |
| 2001/0055719 A1 | 12/2001 | Akashi et al. |
| 2002/0000034 A1 | 1/2002 | Jenson |
| 2002/0001746 A1 | 1/2002 | Jenson |
| 2002/0001747 A1 | 1/2002 | Jenson |
| 2002/0004167 A1 | 1/2002 | Jenson et al. |
| 2002/0009630 A1 | 1/2002 | Gao et al. |
| 2002/0019296 A1 | 2/2002 | Freeman et al. |
| 2002/0028377 A1 | 3/2002 | Gross |
| 2002/0033330 A1 | 3/2002 | Demaray et al. |
| 2002/0037756 A1 | 3/2002 | Jacobs et al. |
| 2002/0066539 A1 | 6/2002 | Muller |
| 2002/0067615 A1 | 6/2002 | Muller |
| 2002/0071989 A1 | 6/2002 | Verma et al. |
| 2002/0076133 A1 | 6/2002 | Li et al. |
| 2002/0091929 A1 | 7/2002 | Ehrensvard |
| 2002/0093029 A1 | 7/2002 | Ballantine et al. |
| 2002/0106297 A1 | 8/2002 | Ueno et al. |
| 2002/0115252 A1 | 8/2002 | Haukka et al. |
| 2002/0134671 A1 | 9/2002 | Demaray et al. |
| 2002/0139662 A1 | 10/2002 | Lee |
| 2002/0140103 A1 | 10/2002 | Kloster et al. |
| 2002/0159245 A1 | 10/2002 | Murasko et al. |
| 2002/0161404 A1 | 10/2002 | Schmidt |
| 2002/0164441 A1 | 11/2002 | Amine et al. |
| 2002/0170821 A1 | 11/2002 | Sandlin et al. |
| 2002/0170960 A1 | 11/2002 | Ehrensvard et al. |
| 2003/0019326 A1 | 1/2003 | Han et al. |
| 2003/0022487 A1 | 1/2003 | Yoon et al. |
| 2003/0024994 A1 | 2/2003 | Ladyansky |
| 2003/0029493 A1 | 2/2003 | Plessing |
| 2003/0035906 A1 | 2/2003 | Memarian et al. |
| 2003/0036003 A1 | 2/2003 | Shchori et al. |
| 2003/0042131 A1 | 3/2003 | Johnson |
| 2003/0044665 A1 | 3/2003 | Rastegar et al. |
| 2003/0048635 A1 | 3/2003 | Knoerzer et al. |
| 2003/0063883 A1 | 4/2003 | Demaray et al. |
| 2003/0064292 A1 | 4/2003 | Neudecker et al. |
| 2003/0068559 A1 | 4/2003 | Armstrong et al. |
| 2003/0077914 A1 | 4/2003 | Le et al. |
| 2003/0079838 A1 | 5/2003 | Brcka |
| 2003/0091904 A1 | 5/2003 | Munshi |
| 2003/0095463 A1 | 5/2003 | Shimada et al. |
| 2003/0097858 A1 | 5/2003 | Strohhofer et al. |
| 2003/0109903 A1 | 6/2003 | Berrang et al. |
| 2003/0127319 A1 | 7/2003 | Demaray et al. |
| 2003/0134054 A1 | 7/2003 | Demaray et al. |
| 2003/0141186 A1 | 7/2003 | Wang et al. |
| 2003/0143853 A1 | 7/2003 | Celii et al. |
| 2003/0152829 A1 | 8/2003 | Zhang et al. |
| 2003/0162094 A1 | 8/2003 | Lee et al. |
| 2003/0173207 A1 | 9/2003 | Zhang et al. |
| 2003/0173208 A1 | 9/2003 | Pan et al. |
| 2003/0174391 A1 | 9/2003 | Pan et al. |
| 2003/0175142 A1 | 9/2003 | Milonopoulou et al. |
| 2003/0178623 A1 | 9/2003 | Nishiki et al. |
| 2003/0178637 A1 | 9/2003 | Chen et al. |
| 2003/0180610 A1 | 9/2003 | Felde et al. |

| | | |
|---|---|---|
| 2003/0185266 A1 | 10/2003 | Henrichs |
| 2003/0231106 A1 | 12/2003 | Shafer |
| 2003/0232248 A1 | 12/2003 | Iwamoto et al. |
| 2004/0008587 A1 | 1/2004 | Siebott et al. |
| 2004/0015735 A1 | 1/2004 | Norman |
| 2004/0023106 A1 | 2/2004 | Benson et al. |
| 2004/0028875 A1 | 2/2004 | Van Rijn et al. |
| 2004/0029311 A1 | 2/2004 | Snyder et al. |
| 2004/0038050 A1 | 2/2004 | Saijo et al. |
| 2004/0043557 A1 | 3/2004 | Haukka et al. |
| 2004/0048157 A1 | 3/2004 | Neudecker et al. |
| 2004/0058237 A1 | 3/2004 | Higuchi et al. |
| 2004/0077161 A1 | 4/2004 | Chen et al. |
| 2004/0078662 A1 | 4/2004 | Hamel et al. |
| 2004/0081415 A1 | 4/2004 | Demaray et al. |
| 2004/0081860 A1 | 4/2004 | Hundt et al. |
| 2004/0085002 A1 | 5/2004 | Pearce |
| 2004/0101761 A1 | 5/2004 | Park et al. |
| 2004/0105644 A1 | 6/2004 | Dawes |
| 2004/0106038 A1 | 6/2004 | Shimamura et al. |
| 2004/0106046 A1 | 6/2004 | Inda |
| 2004/0118700 A1 | 6/2004 | Schierle-Arndt et al. |
| 2004/0126305 A1 | 7/2004 | Chen et al. |
| 2004/0151986 A1 | 8/2004 | Park et al. |
| 2004/0161640 A1 | 8/2004 | Salot |
| 2004/0175624 A1 | 9/2004 | Luski et al. |
| 2004/0188239 A1 | 9/2004 | Robison et al. |
| 2004/0209159 A1 | 10/2004 | Lee et al. |
| 2004/0214079 A1 | 10/2004 | Simburger et al. |
| 2004/0219434 A1 | 11/2004 | Benson et al. |
| 2004/0245561 A1 | 12/2004 | Sakashita et al. |
| 2004/0258984 A1 | 12/2004 | Ariel et al. |
| 2004/0259305 A1 | 12/2004 | Demaray et al. |
| 2005/0000794 A1 | 1/2005 | Demaray et al. |
| 2005/0006768 A1 | 1/2005 | Narasimhan et al. |
| 2005/0048802 A1 | 3/2005 | Zhang et al. |
| 2005/0070097 A1 | 3/2005 | Barmak et al. |
| 2005/0072458 A1 | 4/2005 | Goldstein |
| 2005/0079418 A1 | 4/2005 | Kelley et al. |
| 2005/0095506 A1 | 5/2005 | Klaassen |
| 2005/0105231 A1 | 5/2005 | Hamel et al. |
| 2005/0110457 A1 | 5/2005 | LaFollette et al. |
| 2005/0112461 A1 | 5/2005 | Amine et al. |
| 2005/0118464 A1 | 6/2005 | Levanon |
| 2005/0130032 A1 | 6/2005 | Krasnov et al. |
| 2005/0133361 A1 | 6/2005 | Ding et al. |
| 2005/0141170 A1 | 6/2005 | Honda et al. |
| 2005/0142447 A1 | 6/2005 | Nakai et al. |
| 2005/0147877 A1 | 7/2005 | Tarnowski et al. |
| 2005/0158622 A1 | 7/2005 | Mizuta et al. |
| 2005/0170736 A1* | 8/2005 | Cok ........................ 445/24 |
| 2005/0175891 A1 | 8/2005 | Kameyama et al. |
| 2005/0176181 A1 | 8/2005 | Burrows et al. |
| 2005/0181280 A1 | 8/2005 | Ceder et al. |
| 2005/0183946 A1 | 8/2005 | Pan et al. |
| 2005/0189139 A1 | 9/2005 | Stole |
| 2005/0208371 A1 | 9/2005 | Kim et al. |
| 2005/0239917 A1 | 10/2005 | Nelson et al. |
| 2005/0266161 A1 | 12/2005 | Medeiros et al. |
| 2006/0019504 A1 | 1/2006 | Taussig |
| 2006/0021214 A1 | 2/2006 | Jenson et al. |
| 2006/0040177 A1 | 2/2006 | Onodera et al. |
| 2006/0046907 A1 | 3/2006 | Rastegar et al. |
| 2006/0054496 A1 | 3/2006 | Zhang et al. |
| 2006/0057283 A1 | 3/2006 | Zhang et al. |
| 2006/0057304 A1 | 3/2006 | Zhang et al. |
| 2006/0063074 A1 | 3/2006 | Jenson et al. |
| 2006/0071592 A1 | 4/2006 | Narasimhan et al. |
| 2006/0155545 A1 | 7/2006 | Jayne |
| 2006/0201583 A1 | 9/2006 | Michaluk et al. |
| 2006/0210779 A1 | 9/2006 | Weir et al. |
| 2006/0222954 A1 | 10/2006 | Skotheim et al. |
| 2006/0234130 A1 | 10/2006 | Inda |
| 2006/0237543 A1 | 10/2006 | Goto et al. |
| 2006/0255435 A1 | 11/2006 | Fuergut et al. |
| 2006/0286448 A1 | 12/2006 | Snyder et al. |
| 2007/0009802 A1 | 1/2007 | Lee et al. |
| 2007/0023275 A1 | 2/2007 | Tanase et al. |
| 2007/0037058 A1 | 2/2007 | Visco et al. |
| 2007/0053139 A1 | 3/2007 | Zhang et al. |
| 2007/0087230 A1 | 4/2007 | Jenson et al. |
| 2007/0091543 A1 | 4/2007 | Gasse et al. |
| 2007/0125638 A1 | 6/2007 | Zhang et al. |
| 2007/0141468 A1 | 6/2007 | Barker |
| 2007/0148065 A1 | 6/2007 | Weir et al. |
| 2007/0148553 A1 | 6/2007 | Weppner |
| 2007/0151661 A1 | 7/2007 | Mao et al. |
| 2007/0164376 A1 | 7/2007 | Burrows et al. |
| 2007/0166612 A1 | 7/2007 | Krasnov et al. |
| 2007/0184345 A1 | 8/2007 | Neudecker et al. |
| 2007/0196682 A1 | 8/2007 | Visser et al. |
| 2007/0202395 A1 | 8/2007 | Snyder et al. |
| 2007/0205513 A1 | 9/2007 | Brunnbauer et al. |
| 2007/0210459 A1 | 9/2007 | Burrows et al. |
| 2007/0224951 A1 | 9/2007 | Gilb et al. |
| 2007/0264564 A1 | 11/2007 | Johnson et al. |
| 2007/0278653 A1 | 12/2007 | Brunnbauer et al. |
| 2007/0298326 A1 | 12/2007 | Angell et al. |
| 2008/0003496 A1 | 1/2008 | Neudecker et al. |
| 2008/0008936 A1 | 1/2008 | Mizuta et al. |
| 2008/0014501 A1 | 1/2008 | Skotheim et al. |
| 2008/0057397 A1 | 3/2008 | Skotheim et al. |
| 2008/0213672 A1 | 9/2008 | Skotheim et al. |
| 2008/0233708 A1 | 9/2008 | Hisamatsu |
| 2008/0254575 A1 | 10/2008 | Fuergut et al. |
| 2008/0261107 A1 | 10/2008 | Snyder et al. |
| 2008/0286651 A1 | 11/2008 | Neudecker et al. |
| 2009/0181303 A1 | 7/2009 | Neudecker et al. |
| 2010/0032001 A1 | 2/2010 | Brantner |
| 2010/0086853 A1 | 4/2010 | Venkatachalam et al. |

FOREIGN PATENT DOCUMENTS

| | | |
|---|---|---|
| CN | 1532984 | 9/2004 |
| DE | 10 2005 014 427 A1 | 9/2006 |
| DE | 10 2006 054 309 A1 | 11/2006 |
| DE | 10 2008 016 665 A1 | 10/2008 |
| DE | 102007030604 | 1/2009 |
| EP | 0 510 883 | 10/1992 |
| EP | 0 639 655 | 2/1995 |
| EP | 0 652 308 | 5/1995 |
| EP | 0 820 088 | 1/1998 |
| EP | 1 068 899 | 1/2001 |
| EP | 0 867 985 | 2/2001 |
| EP | 1 092 689 | 4/2001 |
| EP | 1 189 080 | 3/2002 |
| EP | 1 713 024 A1 | 10/2006 |
| FR | 2 861 218 | 4/2005 |
| JP | 55009305 | 1/1980 |
| JP | 56156675 | 12/1981 |
| JP | 60068558 | 4/1985 |
| JP | 62267944 | 11/1987 |
| JP | 2-054764 | 2/1990 |
| JP | 2230662 | 9/1990 |
| JP | 4058456 | 2/1992 |
| JP | 4072049 | 3/1992 |
| JP | 6-010127 | 1/1994 |
| JP | 6-100333 | 4/1994 |
| JP | 7-233469 | 5/1995 |
| JP | 7-224379 | 8/1995 |
| JP | 11204088 | 7/1999 |
| JP | 2000144435 | 5/2000 |
| JP | 2000188099 | 7/2000 |
| JP | 2000268867 | 9/2000 |
| JP | 2001259494 | 9/2001 |
| JP | 2001297764 | 10/2001 |
| JP | 2001328198 | 11/2001 |
| JP | 2002-344115 | 11/2002 |
| JP | 2003-17040 | 1/2003 |
| JP | 2003347045 | 12/2003 |
| JP | 2004071305 | 3/2004 |
| JP | 2004149849 | 5/2004 |
| JP | 2004-158268 | 6/2004 |
| JP | 2004273436 | 9/2004 |
| JP | 2005-256101 | 9/2005 |
| KR | 20020007881 | 1/2002 |
| KR | 20020017790 | 3/2002 |
| KR | 20020029813 | 4/2002 |
| KR | 20020038917 | 5/2002 |

| | | |
|---|---|---|
| KR | 20030033913 | 5/2003 |
| KR | 20030042288 | 5/2003 |
| KR | 20030085252 | 11/2003 |
| RU | 2241281 | 11/2004 |
| WO | WO 9513629 | 5/1995 |
| WO | WO 9623085 | 8/1996 |
| WO | WO 9623217 | 8/1996 |
| WO | WO 9727344 | 7/1997 |
| WO | WO 9735044 | 9/1997 |
| WO | WO 9847196 | 10/1998 |
| WO | WO 9943034 | 8/1999 |
| WO | WO 9957770 | 11/1999 |
| WO | WO 0021898 | 4/2000 |
| WO | WO 0022742 | 4/2000 |
| WO | WO 0028607 | 5/2000 |
| WO | WO 0036665 | 6/2000 |
| WO | WO 0060682 | 10/2000 |
| WO | WO 0060689 | 10/2000 |
| WO | WO 0062365 | 10/2000 |
| WO | WO 0101507 | 1/2001 |
| WO | WO 0117052 A2 | 3/2001 |
| WO | WO 0124303 | 4/2001 |
| WO | WO 0133651 A1 | 5/2001 |
| WO | WO 0139305 A1 | 5/2001 |
| WO | WO 0173864 A2 | 10/2001 |
| WO | WO 0173865 A2 | 10/2001 |
| WO | WO 0173866 A2 | 10/2001 |
| WO | WO 0173868 A2 | 10/2001 |
| WO | WO 0173870 A2 | 10/2001 |
| WO | WO 0173883 A2 | 10/2001 |
| WO | WO 0173957 A2 | 10/2001 |
| WO | WO 0182390 | 11/2001 |
| WO | WO 0212932 | 2/2002 |
| WO | WO 0242516 | 5/2002 |
| WO | WO 0247187 A1 | 6/2002 |
| WO | WO 02071506 | 9/2002 |
| WO | WO 02101857 | 12/2002 |
| WO | WO 03003485 | 1/2003 |
| WO | WO 03005477 | 1/2003 |
| WO | WO 03026039 | 3/2003 |
| WO | WO 03036670 | 5/2003 |
| WO | WO 03069714 | 8/2003 |
| WO | WO 03080325 | 10/2003 |
| WO | WO 03083166 | 10/2003 |
| WO | WO 2004012283 | 2/2004 |
| WO | WO 2004021532 | 3/2004 |
| WO | WO 2004061887 | 7/2004 |
| WO | WO 2004077519 | 9/2004 |
| WO | WO 2004086550 | 10/2004 |
| WO | WO 2004093223 | 10/2004 |
| WO | WO 2004106581 | 12/2004 |
| WO | WO 2004106582 | 12/2004 |
| WO | WO 2005008828 | 1/2005 |
| WO | WO 2005013394 | 2/2005 |
| WO | WO 2005038957 | 4/2005 |
| WO | WO 2005067645 | 7/2005 |
| WO | WO 2005085138 | 9/2005 |
| WO | WO 2005091405 | 9/2005 |
| WO | WO 2006063308 | 6/2006 |
| WO | WO 2007016781 | 2/2007 |
| WO | WO 2007027535 | 3/2007 |
| WO | WO 2007095604 A2 | 8/2007 |
| WO | WO 2008036731 A2 | 3/2008 |

OTHER PUBLICATIONS

Wang et al., "Characterization of Thin-Film Rechargeable Lithium Batteries with Lithium Cobalt Oxide Cathodes," 143 J. Electrochem. Soc. 3203-13 (1996).
Triechel, O. and Kirchhoff, V., "The influences of pulsed magnetron sputtering on topography and crystallinity of $TiO_2$ films on glass," Surface and Coating Technology 123:268-272 (2000).
Tukamoto, H. and West, A.R., "Electronic Conductivity of $LiCoO_s$ and Its Enhancement by Magnesium Doping," J. Electrochem. Soc 144(9):3164-3168 (1997).
Van Dover, R.B., "Amorphous Lanthanide-Doped $TiO_x$ Dielectric Films," Appl. Phys. Lett. 74(20):3041-3043 (1999).
Viljanen, J. and Leppihalme, M., "Planner Optical Coupling Elements for Multimode Fibers with Two-Step Ion Migration Process," Applied Physics 24(1):61-63 (1981).
Villegas, M.A. et al., "Optical spectroscopy of a soda lime glass exchanged with silver," Phys. Chem. Glasses 37(6):248-253 (1996).
Von Rottkay, K. et al., "Influences of stoichiometry on electrochromic cerium-titanium oxide compounds," Presented at the 11th Int'l Conference of Solid State Ionics, Honolulu, Hawaii, Nov. 19, 1997, Published in Solid State Ionics 113-115:425-430. (1998).
Westlinder, J. et al., "Simulations and Dielectric Characterization of Reactive dc Magnetron Cosputtered $(Ta_2O_5)_{1-x}(TiO_2)_x$ Thin Films," J Vac. Sci. Technol. B 20(3):855-861 (May/Jun. 2002).
Wilkes, K.E., "Gas Permeation Through Vacuum Barrier Films and its Effect on VIP Thermal Performance," presented at the Vacuum Insulation Panel Symp., Baltimore, Maryland, 21 pages (May 3, 1999).
Yanagawa, H. et al., "Index-and-Dimensional Taper and Its Application to Photonic Devices," J. Lightwave Technology 10(5):587-591 (1992).
Yoshikawa, K. et al., "Spray formed aluminum alloys for sputtering targets," Powder Metallurgy 43(3): 198-199 (2000).
Zhang, H. et al., "High Dielectric Strength, High k $TiO_2$ Films by Pulsed DC, Reactive Sputter Deposition," 5 pages.
Affinito, J.D. et al., "PML/oxide/PML barrier layer performance differences arising from use of UV or electron beam polymerization of the PML layers," Thin Solid Films 308-309: 19-25 (1997).
Affinito, J.D. et al., "Polymer-oxide transparent barrier layers," Society of Vacuum Coaters, 39th Ann. Technical Conference Proceedings, May 5-10, 1996, Philadelphia, PA, pp. 392-397 (1996).
Alder, T. et al., "High-efficiency fiber-to-chip coupling using low-loss tapered single-mode fiber," IEEE Photonics Tech. Lett. 12(8): 1016-1018 (2000).
Almeida, V.R. et al., "Nanotaper for compact mode conversion," Optics Letters 28(15): 1302-1304 (2003).
Anh et al., "Significant Suppression of Leakage Current in $(Ba,Sr)TiO_3$ Thin Films by Ni or Mn Doping," J. Appl. Phys.,92(5): 2651-2654 (Sep. 2002).
Asghari, M. and Dawnay, E., "ASOC™—a manufacturing integrated optics technology," SPIE 3620: 252-262 (Jan. 1999).
Barbier, D. et al., "Amplifying four-wavelength combiner, based on erbium/ytterbium-doped waveguide amplifiers and integrated splitters," IEEE Photonics Tech. Lett. 9:315-317 (1997).
Barbier, D., "Performances and potential applications of erbium doped planar waveguide amplifiers and lasers," Proc. OAA, Victoria, BC, Canada, pp. 58-63 (Jul. 21-23, 1997).
Beach R.J., "Theory and optimization of lens ducts," Applied Optics 35(12): 2005-2015 (1996).
Belkind, A. et al., "Pulsed-DC Reactive Sputtering of Dielectrics: Pulsing Parameter Effects," 43rd Annual Technical Conference Proceedings (2000).
Belkind, A. et al., "Using pulsed direct current power for reactive sputtering of $Al_2O_3$," J. Vac. Sci. Technol. A 17(4): 1934-1940 (1999).
Bestwick, T., "ASOC™ silicon integrated optics technology," SPIE 3631: 182-190 (1999).
Borsella, E. et al., "Structural incorporation of silver in soda-lime glass by the ion-exchange process: a photoluminescence spectroscopy study," Applied Physics A 71: 125-132 (2000).
Byer, R.L., "Nonlinear optics and solid-state lasers: 2000," IEEE J. Selected Topics in Quantum Electronics 6(6): 911-930 (2000).
Campbell, S.A. et al., "Titanium dioxide (TiO2)-based gate insulators," IBM J. Res. Develop. 43(3): 383-392 (1999).
Chang, C.Y. and Sze, S.M. (eds.), in ULSI Technology, The McGraw-Hill Companies, Inc., Nyew York, Chapter 4, pp. 169-170 and 226-231 (1996).
Chen, G. et al., "Development of supported bifunctional electrocatalysts for unitized regenerative fuel cells," J. Electrochemical Society 149(8): A1092-A1099 (2002).
Choi, Y.B. et al., "Er-Al-codoped silicate planar light waveguide-type amplifier fabricated by radio-frequency sputtering," Optics Letters 25(4): 263-265 (2000).

Choy et al., "Eu-Doped Y2O3 Phosphor Films Produced by Electrostatic-Assisted Chemical Vapor Deposition," J. Mater. Res. 14(7): 3111-3114 (Jul. 1999).
Cocorullo, G. et al., "Amorphous silicon waveguides and light modulators for integrated photonics realized by low-temperature plasma-enhanced chemical-vapor deposition," Optics Lett. 21(24): 2002-2004 (1996).
Cooksey, K. et al., "Predicting permeability & Transmission rate for multilayer materials," Food Technology 53(9): 60-63 (1999).
Crowder, M.A. et al., "Low-temperature single-crystal Si TFT's fabricated on Si films processed via sequential lateral solidification," IEEE Electron Device Lett. 19(8): 306-308 (1998).
Delavaux, J-M. et al., "Integrated optics erbium ytterbium amplifier system in 10Gb/s fiber transmission experiment," $22^{nd}$ European Conference on Optical Communication, Osla, I.123-I.126 (1996).
Distributed Energy Resources: Fuel Cells, Projects, 4 pages http://www.eere.energy.gov/der/fuel_cells/projects.html (2003).
Dorey, R.A., "Low temperature micromoulding of functional ceramic devices," Grant summary for GR/S84156/01 for the UK Engineering and Physical Sciences Research Council, 2 pages (2004).
DuPont Teijin Films, Mylar 200 SBL 300, Product Information, 4 pages (2000).
Electrometals Technologies Limited, Financial Report for 2002, Corporate Directory, Chairman's review, Review of Operations, 10 pages (2002).
E-Tek website: FAQ, Inside E-Tek, E-TEk News, Products; http://www.etek-inc.com/, 10 pages (2003).
Flytzanis, C. et al., "Nonlinear optics in composite materials," in Progress in Optics XXIX, Elsevier Science Publishers B.V., pp. 323-425 (1991).
Frazao, O. et al., "EDFA gain flattening using long-period fibre gratings based on the electric arc technique," Proc. London Comm. Symp. 2001, London, England, 3 pages (2001).
Hwang et al., "Characterization of Sputter-Deposited $LiMn_2O_4$ Thin Films for Rechargeable Microbatteries," 141(12) J. Electrochem. Soc. 3296-99 (1994).
Jones et al., 53-56 Solid State Ionics 628 (1992).
Mattox "Handbook of Physical Vapor Deposition (PVD) Processing, Society of Vacuum Coaters," Albuquerque, New Mexico 660f and 692ff, Noyes Publications (1998).
Sarro, P., "Silicon Carbide as a New MEMS Technology," Sensors and Actuators 82, 210-218 (2000).
Lee, B.H. et al., "Effects of interfacial layer growth on the electrical characteristics of thin titanium oxide films on silion," Appl. Phys. Lett. 74(21):3143-3145 (1999).
Lee, K.K. et al., "Effect of size and roughness on light transmission in a $Si/SiO_2$ waveguide: Experiments and model," Appl. Phys. Left. 77(11):1617-1619 (2000).
Love, J.D. et al., "Quantifying Loss Minimisation in Single-Mode Fibre Tapers," Electronics Letters 22(17):912-914 (1986).
Mardare, D. and Rusu, G.I., "On the structure of Titanium Oxide Thin Films," Andalele Stiintifice Ale Universitatii IASI, Romania, pp. 201-208 (1999).
Marques, P.V.S. et al., "Planar Silica-on-Silicon Waveguide Lasers Based in Two Layers Core Devices," $10^{th}$ European Conference on Integrated Optics, Session WeB2, pp. 79-82 (2001).
Meijerink, A. et al, "Luminescence of $Ag^+$ in Crystalline and Glassy $Srb_4O_7$," J. Physics Chem. Solids 54(8):901-906 (1993).
Mesnaoui, M. et al, "Spectroscopic properties of $Ag^+$ ions in phosphate glasses of $NaPO_3$-$AgPO_3$ system," Eur. J. Solid State Inorg. Chem. 29:1001-1013 (1992).
Mitomi, O. et al., "Design of a Single-Mode Tapered Waveguide for Low-Loss Chip-to-Fiber Coupling," IEEE J. Quantum Electronics 30(8): 1787-1793 (1994).
Mizuno, Y. et al "Temperature dependence of oxide decomposition on titanium surfaces in UHV," J. Vac. Sci & Tech. A. 20(5): 1716-1721 (2002).
Ohkubo, H. et al., Polarization-Insensitive Arrayed-Waveguide Grating Using Pure $SiO_2$ Cladding, Fifth Optoelectronics and Communication Conference (OECC 2000) Technical Digest, pp. 366-367 (2000).

Ohmi, S. et al., "Rare earth mental oxides for high-K fate insulator," VLSI Design 2004, 1 Page (2004).
Ohtsuki, T., et al., "Gain Characteristics of high concentration $Er^{3+}$-doped phosphate glass waveguide," J. Appl. Phys. 78(6):3617-3621 (1995).
Ono, H. et al., "Design of a Low-loss Y-branch Optical Waveguide," Fifth Optoelectronic and Communications Conference (OECC 2000) Technical Digest, pp. 502-503 (2000).
Padmini, P. et al. "Realization of High Tunability Barium Strontium Titanate Thin Films by rf Megnetron Sputtering," Appl. Phys. Lett. 75(20):3186-3188 (1999).
Pan, T. et al., "Planar $Er^{3+}$-doped aluminosilicate waveguide amplifier with more than 10 dB gain across C-band," Optical Society of America, 3 pages (2000).
Park et al., "Characteristics of Pt Thin Film on the Conducting Ceramics TiO and Ebonex ($Ti_4O_7$) as Electrode Materials," Thin Solid Films 258: 5-9 (1995).
Peters, D.P. et al., "Formation mechanism of silver nanocrystals made by ion irradiation of $Na^+$—$Ag^+$ion-exchanged sodalime silicate glass," Nuclear Instruments and Methods in Physics Research B 168:237-244 (2000).
Rajarajan, M. et al., "Numerical Study of Spot-Size Expanders fro an Efficient OEIC to SMF Coupling," IEEE Photonics Technology Letters 10(8): 1082-1084 (1998).
Ramaswamy, R.V. et al., "Ion-Exchange Glass Waveguides: A Review," J. Lightwave Technology 6(6): 984-1002 (1988).
Roberts, S.W. et al., "The Photoluminescence of Erbium-doped Silicon Monoxide," University of Southampton, Department of Electronics and Computer Science Research Journal, 7 pages (1996).
Saha et al., "Large Reduction of Leakage Current by Graded-Layer La Doping in $(Ba0.5,Sr0.5)TiO3$ Thin Films," Appl. Phys. Lett. 79(1): 111-113 (Jul. 2001).
Sanyo Vacuum Industries Co., Ltd. Products Infor, $TiO_2$, (2003), 1 page, http://www.sanyovac.co.jp/Englishweb/products?EtiO2.htm.
Schermer, R. et al., "Investigation of Mesa Dielectric Waveguides," Proceedings of the OSA Integrated Photonics Research Topical Meeting and Exhibit, Paper No. IWB3, 3 pages (2001).
Schiller, S. et al., "PVD Coating of Plastic Webs and Sheets with High Rates on Large Areas," European Materials Research Society 1999 Spring Meeting, Jun. 1-4, 1999, Strasbourg, France, 13 pages (1999).
Scholl, R., "Power Supplies for Pulsed Plasma Technologies: State-of-the-Art and Outlook," Advances Energy Industries, Inc. 1-8 (1999).
Scholl, R., "Power Systems for Reactive Sputtering of Insulating Films," Advances Energy Industries, Inc., 1-8 (Aug. 2001).
Second International Symposium of Polymer Surface Modification: Relevance to Adhesion, Preliminary Program, 13 pages (1999).
Seventh International Conference on $TiO_2$ Photocatalysis: Fundamentals & Applications, Toronto, Ontario, Canada, Final Program, 7 pages (Nov. 17-21, 2002).
Sewell, P. et al., "Rib Waveguide Spot-Size Transformers: Modal Properties," J Lightwave Technology 17(5):848-856 (1999).
Shaw, D.G. et al., "Use of Vapor Deposited Acrylate Coatings to Improve the Barrier Properties of Metallized Film," Society of Vacuum Coaters, $37^{th}$ Annual Technical Conference Proceedings, pp. 240-244 (1994).
Shin, J.C. et al. "Dielectric and Electrical Properties of Sputter Grown $(Ba,Se)TiO_3$ Thin Films," J. Appl. Phys. 86(1):506-513 (1999).
Shmulovich, J. et al., "Recent progress in Erbium-doped waveguide amplifiers," Bell Laboratories, pp. 35-37 (1999).
Slooff, L.H. et al., "Optical properties of Erbium-doped organic polydentate cage complexes," J. Appl. Phys. 83(1):497-503 (1998).
Smith, R.E. et al., "Reduced Coupling Loss Using a Tapered-Rib Adiabatic-Following Fiber Coupler," IEEE Photonics Technology Lett. 8(8):1052-1054 (1996).
Snoeks, E. et al., "Cooperative upconversion in erbium-implanted soda-lime silicate glass optical waveguides," J. Opt. Soc. Am. B 12(8): 1468-1474 (1995).
Strohhofer, C. and Polman, A. "Energy transfer to $Er^{3+}$ in Ag ion-exchanged glass," FOM Institute for Atomic and Molecular Physics, 10 pages (2001).

Sugiyama, A. et al., "Gas Permeation Through the Pinholes of Plastic Film Laminated with Aluminum Foil," Vuoto XXVIII(1-2):51-54 (1999).

Tervonen, A. "Challenges and opportunities for integrated optics in optical networks," SPIE 3620:2-11 (1999).

Ting, C.Y. et al., "Study of planarized sputter-deposited $SiO_2$," J. Vac. Sci Technol, 15(3):1105-1112 (1978).

Tomaszewski, H. et al., "Yttria-stabilized zirconia thin films grown by reactive r.f. magnetron sputtering," Thin Solid Films 287: 104-109 (1996).

Fujii, M. et al., "1.54 μm photoluminescence of $Er^{3+}$ doped into $SiO_2$ films containing Si nanocrystals: evidence for energy transfer from Si nanocrystals for $Er_{3+}$," Appl. Phys. Lett. 71(9): 1198-1200 (1997).

Garcia, C. et al., "Size dependence of lifetime and absorption cross section of Si nanocrystals embedded in $SiO_2$," Appl. Phys. Left. 82(10): 1595-1597 (2003).

Goossens, A. et al., "Sensitization of $TiO_2$ with p-type semiconductor polymers," Chem. Phys. Lett. 287: 148 (1998).

Greene, J.E. et al., "Morphological and electrical properties of rf sputtered $Y_2O_3$-doped $ZrO_2$ thin films," J. Vac. Sci. Tech. 13(1): 72-75 (1976).

Han, H.-S. et al., "Optical gain at 1.54 μm in Erbium-doped Silicon nanocluster sensitized waveguide," Appl. Phys. Lett. 79(27): 4568-4570 (2001).

Hayakawa, T. et al., "Enhanced fluorescence from $Eu^{3+}$ owing to surface plasma oscillation of silver particles in glass," J. Non-Crystalline Solids 259: 16-22 (1999).

Hayakawa, T. et al., "Field enhancement effect of small Ag particles on the fluorescence from $Eu^{3+}$-doped $SiO_2$ glass," Appl. Phys. Lett, 74(11): 1513-1515 (1999).

Hayfield, P.C.S., I Development of a New Material-Monolithic $Ti_4O_7$ Ebonix® Ceramic, Royal Society of Chemistry, Cambridge, Table of Contents, 4 pages (2002).

Hehlen, M.P. et al., "Spectroscopic properties of $Er^{3+}$-and $Yb^{3+}$-doped soda-lime silicate and aluminosilicate glasses," Physical Review B 56(15): 9302-9318 (1997).

Hehlen, M.P. et al., "Uniform upconversion in high-concentration $Er^{3+}$-doped soda lime silicate and aluminosilicate glasses," Optics Letters 22(11); 772-774 (1997).

Horst, F. et al., "Compact, tunable optical devices in silicon-oxynitride waveguide technology," Top. Meeting Integrated Photonics Res. '00, Quebec, Canada, p. IThF1, 3 pages (2000).

Howson, R.P., "The reactive sputtering of oxides and nitrides," Pure & Appl. Chem. 66(6): 1311-1318 (1994).

Hubner, J. and Guldberg-Kjaer, S., "Planar Er- and Yb-doped amplifiers and lasers," COM Technical University of Denmark, 10th European Conf. on Integrated Optics, Session WeB2, pp. 71-74 (2001).

Hwang et al., "Characterization of sputter-deposited LiMn2O4 thin films for rechargeable microbatteries," 141(12) J. Electrochem. Soc. 3296-99 (1994).

Hwang, M-S. et al., "The effect of pulsed magnetron sputtering on the properties of iridium tin oxide thin films," Surface and Coatings Tech. 171: 29-33 (2003).

Im, J.S. and Sposili, R.S., "Crystalline Si films for integrated active-matrix liquid crystal displays," MRS Bulletin, pp. 39-48 (1996).

Im, J.S. et al., "Controlled super-lateral growth of Si-films for microstructural manipulation and optimization," Physica Status Solidi (A) 166(2): 603-617 (1998).

Im, J.S. et al., "Single-crystal Si films for thin-film transistor devices," Appl. Physics Lett. 70(25): 3434-3436 (1997).

Itoh, M. et al., "Large reduction of singlemode-fibre coupling loss in 1.5% Δ planar lightwave circuits using spot-size converters," Electronics Letters 38(2): 72-74 (2002).

Jackson, M.K. and Movassaghi, M., "An accurate compact EFA model," Eur. Conf. Optical Comm., Munich, Germany, 2 pages (2000).

Janssen, R. et al., "Photoinduced electron transfer from conjugated polymers onto nanocrystalline $TiO_2$," Synthet. Metal., 1 page (1999).

Johnson, J.E. et al., "Monolithically integrated semiconductor optical amplifier and electroabsorption modulator with dual-waveguide spot-size converter input," IEEE J. Selected topics in Quantum Electronics 6(1): 19-25 (2000).

Jonsson, L.B. et al., "Frequency response in pulsed DC reactive sputtering processes," Thin Solid Films 365: 43-48 (2000).

Kato, K. and Inoue, Y., "Recent progress on PLC hybrid integration," SPIE 3631: 28-36 (1999).

Kato, K. and Tohmori, Y., "PLC hybrid integration technology and its application to photonic components," IEEE J. Selected Topics in Quantum Electronics 6(1): 4-13 (2000).

Kelly, P.J. and Amen, R.D., "Control of the structure and properties of aluminum oxide coatings deposited by pulsed magnetron sputtering," J. Vac. Sci. Technol. A 17(3): 945-953 (1999).

Kelly, P.J. et al., "A novel technique for the deposition of aluminum-doped zinc oxide films," Thin Solid Films 426(1-2): 111-116 (2003).

Kelly, P.J. et al., "Reactive pulsed magnetron sputtering process for alumina films," J. Vac. Sci. Technol. A 18(6): 2890-2896 (2000).

Kik, P.G. and Polman, A., "Gain limiting processes in Er-doped Si nanocrystal waveguides in $SiO_2$," J. Appl. Phys. 91(1): 536-536 (2002).

Kim et al., "Correlation Between the Microstructures and the Cycling Performance of $RuO_2$ Electrodes for Thin-Film Microsupercapacitros," J. Vac. Sci. Technol. B20(5): 1827-1832 (Sep. 2002).

Kim, D-W. et al. "Mixture Behavior and Microwave Dielectric Properties in the Low-fired $TiO_2$—CuO System," Jpn. J. Appl. Phys. 39:2696-2700 (2000).

Kim, H-K. et al., "Characteristics of rapid-thermal-annealed LiCoO2 cathode film for an all-solid-state thin film microbattery," J. Vac. Sci. Technol. A 22(4): 1182-1187 (2004).

Kim, J-Y. et al. "Frequency-dependent pulsed direct current magnetron sputtering of titanium oxide films," J. Vac. Sci. Technol. A 19(2):429-434 (2001).

Ladouceur, F. and Love, J.D., in: Silica-based Buried Channel Waveguides and Devices, Chapman & Hall, London, Table of Contents, 6 pages (1996).

Ladouceur, F. et al., "Effect of side wall roughness in buried channel waveguides," IEEE Proc. Optoelectron. 141(4):242-248 (1994).

Lamb, W. and Zeiler, R., Designing Non-Foil Containing Skins for Vacuum Insulation Panel (VIP) Application, Vuoto XXVIII(1-2):55-58 (1999).

Lamb, W.B., "Designing Nonfoil Containing Skins for VIP Applications," DuPont VIA Symposium Presentation, 35 Pages (1999).

Lange, M.R. et al, "High Gain Ultra-Short Length Phosphate glass Erbium-Doped Fiber Amplifier Material," OSA Optical Fiber Communications (OFC), 3 Pages (2002).

Laporta, P. et al, "Diode-pumped cw bulk Er: Yb: glass laser," Optics Letters 16(24):1952-1954 (1991).

Laurent-Lund, C. et al., "PECVD Grown Multiple Core Planar Waveguides with Extremely Low Interface Reflections and Losses," IEEE Photonics Tech. Lett. 10(10):1431-1433 (1998).

Abraham, K.M. et al., "Inorganic-organic composite solid polymer electrolytes," 147(4) J. Electrochem. Soc. 1251-56 (2000).

Abrahams, I., "$Li_6Zr_2O_7$, a new anion vacancy ccp based structure, determined by ab initio powder diffraction methods," 104 J. Solid State Chem. 397-403 (1993).

Amatucci, G. et al., "Lithium scandium phosphate-based electrolytes for solid state lithium rechargeable microbatteries," 60 Solid State Ionics 357-65 (1993).

Appetecchi, G.B. et al., "Composite polymer electrolytes with improved lithium metal electrode interfacial properties," 145(12) J. Electrochem. Soc. 4126-32 (1998).

Bates, J.B. et al., "Electrical properties of amorphous lithium electrolyte thin films," 53-56 Solid State Ionics 647-54 (1992).

Delmas, C. et al., "Des conducteurs ioniques pseudo-bidimensionnels $Li_8MO_6$ (M = Zr, Sn), $Li_7LO_6$ (L = Nb, Ta) et $Li_6In_2O_6$," 14 Mat. Res. Bull. 619-25 (1979).

Hu, Y-W. et al., "Ionic conductivity of lithium phosphate-doped lithium orthosilicate," 11 Mat. Res. Bull. 1227-30 (1976).

Neudecker, B. et al., "$Li_9SiAlO_8$: a lithium ion electrolyte for voltages above 5.4 V," 143(7) J. Electrochem. Soc. 2198-203 (1996).

Ohno, H. et al., "Electrical conductivity of a sintered pellet of octalithium zirconate," 132 J. Nucl. Mat. 222-30 (1985).

Scholder, V. et al., "Über Zirkonate, Hafnate und Thorate von Barium, Strontium, Lithium und Natrium," Zeitschrift für Anorganische und Allgemeine Chemie, Band 362, pp. 149-168 (1968).

Yu, X. et al., "A stable thin-film lithium electrolyte: lithium phosphorus oxynitride," 144(2) J. Electrochem. Soc. 524-532 (1997).

Dobkin, D.M., "Silicon Dioxide: Properties and Applications".

* cited by examiner

MASKING OF AND MATERIAL CONSTRAINT FOR DEPOSITING BATTERY LAYERS ON FLEXIBLE SUBSTRATES

RELATED APPLICATIONS

This application is related to and claims the benefit under 35 U.S.C §119 of U.S. provisional patent application Ser. No. 60/827,685, entitled "Masking of and Material Constraint for Depositing Battery Layers on Flexible Substrates" filed on Sep. 29, 2006, which is incorporated herein by reference in its entirety.

FIELD OF THE INVENTION

The present invention relates to masking techniques and apparatuses, and in particular, to a method and apparatus for masking a flexible substrate that is to be coated with one or more material layers.

BACKGROUND OF THE INVENTION

Solid state thin film batteries and other thin film devices often require shadow masking to define the various layers of the battery construction. Typical planar device construction relies on rigid substrate and mask materials and hard edge alignment procedures to register the substrate and mask together. The advent of flexible solid state thin film battery technology and the resultant use of thinner substrate and mask materials, both typically in the form of foils or strips, brings the challenge of constraining these flexible materials. Additionally, the challenge of accurately defining the associated thin film coating area during an application of a typical thin film deposition technique, such as physical vapor deposition or chemical vapor deposition arises. The legacy approach, as shown in FIG. 1, is to place a battery substrate 110 into a pocket in a metal plate 115, install a thick rigid mask framework 105 and then constrain this assembly with a clamping mechanism 120. The legacy approach suffers from many issues. For example, the thick rigid masks tend to warp with use and no longer lay flat regardless of the clamping pressure used. Typical vacuum deposition coatings tend to bleed beneath the mask edge thus creating a poorly defined thin film layer edge. Attempts to marry the thin flexible substrates with the legacy equipment suffer because thin flexible substrates and masks rarely lay flat and smooth on a planar surface and thus do not smoothly align against the edges of a defined pocket. This placement error results in a poorly location-registered coating on the surface of the substrate. A poorly location-registered or poorly edge-defined battery layer tends to produce improper battery layer interactions, in these multi-layer battery constructions, with resultant battery failure. The same shortcomings hold true for other thin film devices that typically consist of more than one thin film layer, such as thin film capacitors or transistors.

SUMMARY OF THE INVENTION

The present invention relates to a method and apparatus for masking a substrate. In one embodiment, the method comprises flexing a substrate to provide a curved substrate surface and providing at least one flexible sheet on the curved surface. The substrate and at least one flexible sheet may be a foil or a strip, for example. In a particular embodiment, the curved surface may be an arc. In another embodiment of the present invention, at least one substrate or sheet, or substrates and sheets, may be provided.

In one embodiment of the invention, for example, at least one flexible sheet and/or substrate may be placed in tension. The tension may be created by applying force in a direction substantially tangential to the curved surface. In a particular embodiment, the tension may be created by using a spring pin, for example. The spring pin may comprise any of the following, for example: flat leaf spring, bent leaf spring, coil spring loaded pin, formed and/or bent leaf spring, torsion spring, or a tubular spring. In another embodiment, the tension may be created by use of an elastic material, such as a spring member. In a further embodiment, for example, tension may be created by use of an off-axis roll-down bar. Torque may be further used to apply tension to at least one of the substrate and/or flexible material.

In a further embodiment of the present invention, the tension may, for example, be created independently for each substrate and/or flexible sheet provided.

Another embodiment of the invention, for example, provides a masking apparatus that includes a substrate holder for securing a flexible substrate in a curved state, and a tensioner for creating a tension in a mask placed over a curved surface of the flexible substrate. In one embodiment, the tensioner may, for example, be a spring pin or an off-axis roll-down bar, for example. The curved state may be an arc, for example.

Another embodiment of the present invention, for example, provides a method for masking a substrate that includes the steps of providing a substrate, providing at least one flexible sheet on the substrate, and creating tension in at least one sheet or the substrate to form a surface of each sheet into a curved shape. In one embodiment of the invention, the substrate and/or flexible sheet comprises a foil or a strip, for example, and the curved shape is the form of an arc, for example. In an embodiment of the invention, the tension is created by using a spring pin or off-axis roll-down bar, for example.

DESCRIPTION OF THE PREFERRED EMBODIMENTS

It is to be understood that the present invention is not limited to the particular methodology, compounds, materials, manufacturing techniques, uses, and applications described herein, as these may vary. It is also to be understood that the terminology used herein is used for the purpose of describing particular embodiments only, and is not intended to limit the scope of the present invention. It must be noted that as used herein and in the appended claims, the singular forms "a," "an," and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. Structures described herein are to be understood also to refer to functional equivalents of such structures. All references cited herein are incorporated by reference herein in their entirety.

Placing a clean, uniform thin strip or foil of material in tension across a planar, flat surface creates a region of two substantially parallel, non-contacting laces between the strip or foil and the surface. There is no substantial interaction between the tension inducing force vectors and the planar, flat surface and thus no translated downward force is produced. In contrast, a downward force is realized when a tangential force is applied to a thin foil or strip across a curved surface. Simple vector analysis shows a greater downward force is generated even with small radii of curvature. The resultant downward force can be put to beneficial use in creating tight mask-to-substrate interfaces, and thus thin film coatings with well defined edges.

Figure 1:
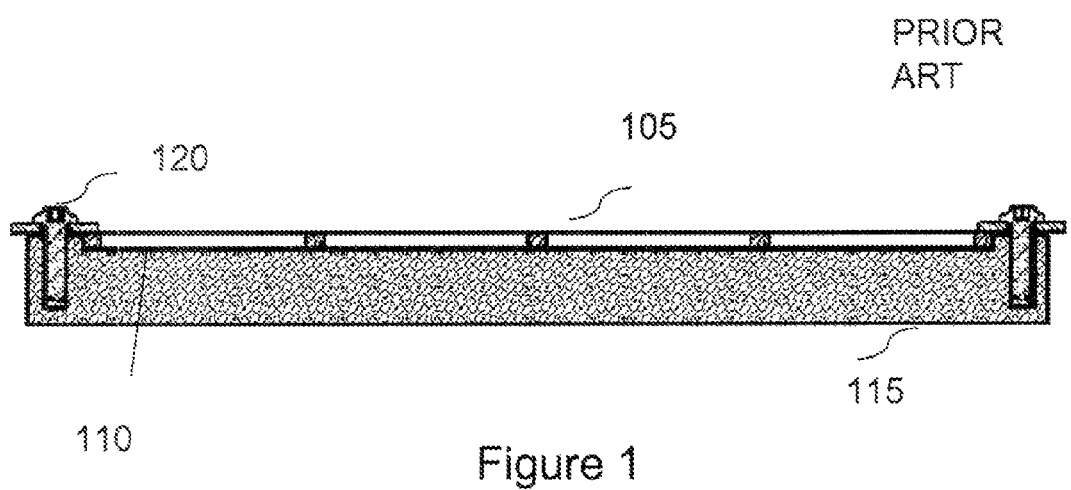
FIG. 1 is an apparatus for retaining substrates or films in a fixed and flat position (prior art).
Figure 2:
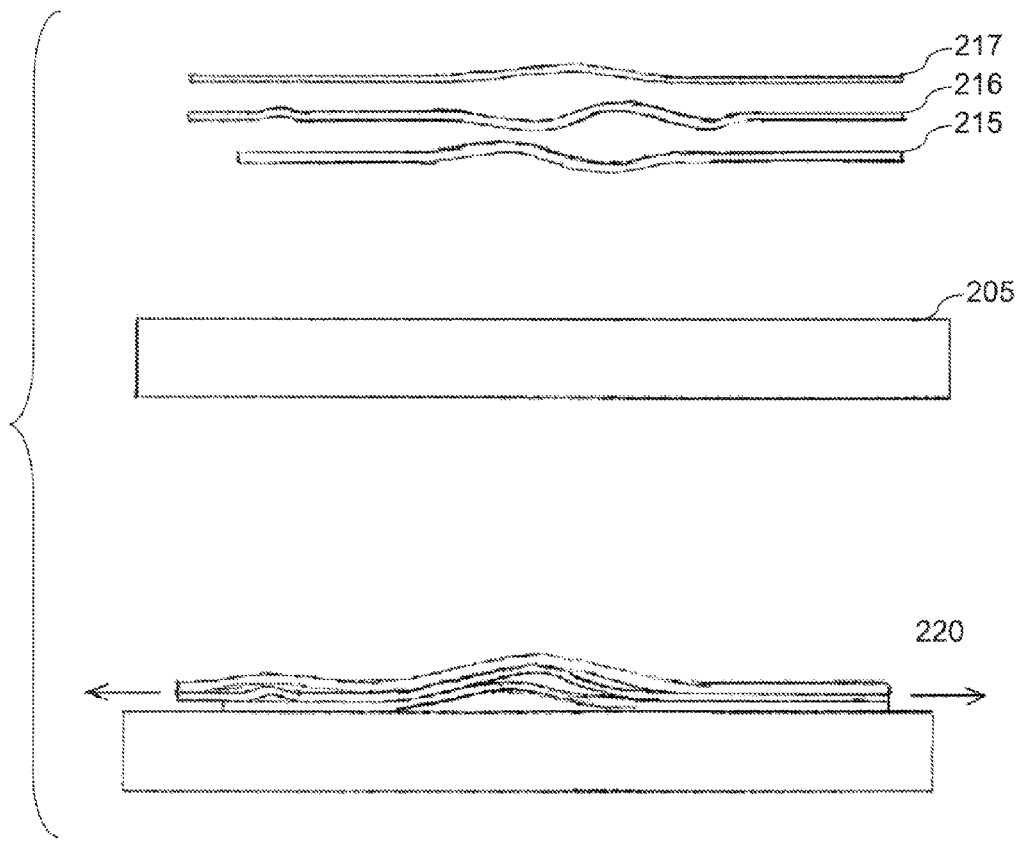
FIG. 2 shows a fiat, planar retaining structure wherein the substrate and flexible sheets are not in uniform flatness/planarity.
Figure 3:
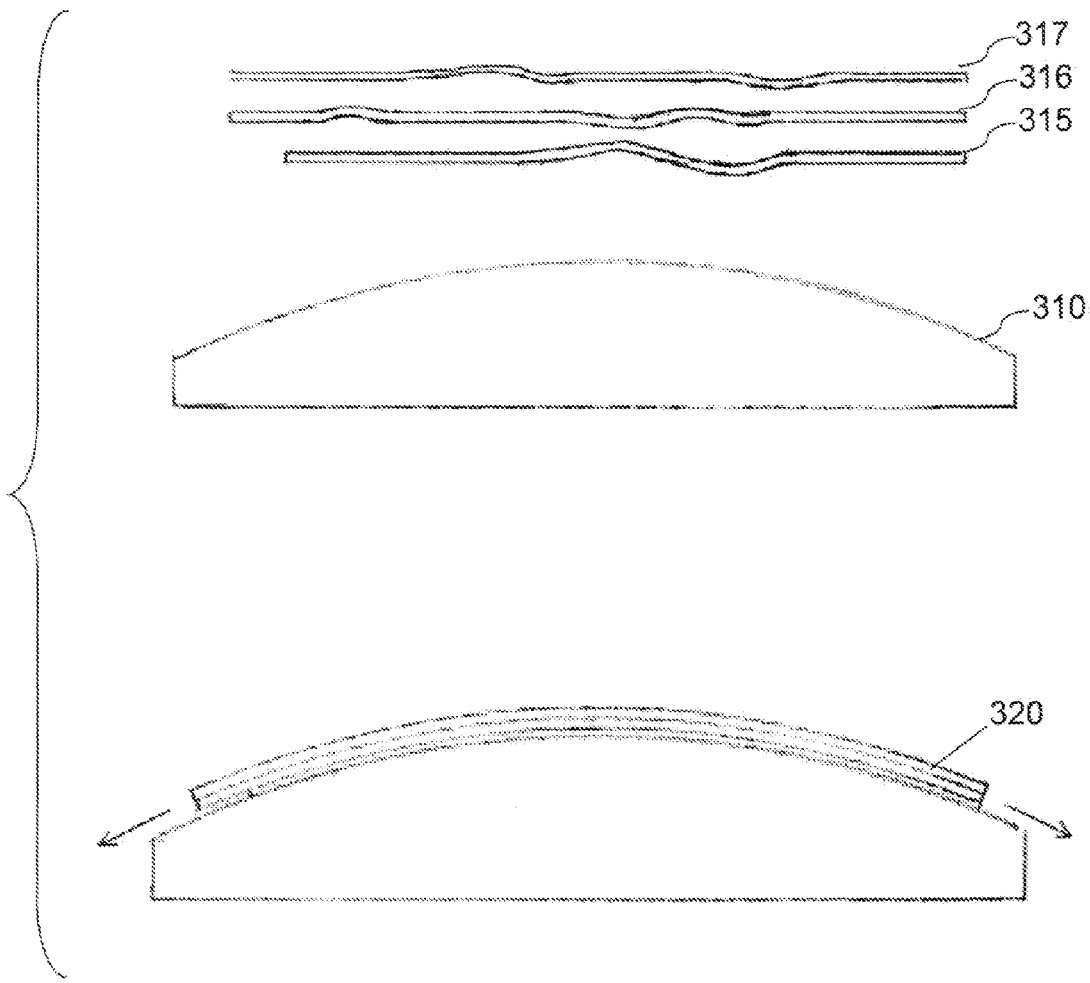
FIG. 3 depicts a holder with a curved surface that provides flexible sheets with a curved surface. It also depicts an embodiment of the present invention wherein the substrate and flexible sheets are tightened by flexing a substrate to provide a curved substrate surface and placing a flexible sheet on the curved surface.

Referring to FIG. 2, the manufacture of thin foils or strips rarely produces uniform and flat bodies. There is typically some error, however minor, that causes a bend deviation 215, 216, 217. For example, foils or strips of material may have cupping, bowing and twisting. In addition, a film layer coated onto such foils or strips may cause an additional bend error. For example, even if a perfectly flat foil or strip of substrate or shadow mask is realized, as the coated layer is grown on the surfaces, stresses inherent to the coating film layer in contact with the surfaces can cause a deformation to occur. More typically, the substrates and masks that must be stacked on top of each other for shadow masking purposes in vacuum deposition processes are bent due to cutting, handling and use. As demonstrated in FIG. 2, when a flat surface 205 is utilized for stacking, even when significant tension forces are applied parallel to the plane, it is typically very difficult to cause the foils or strips 215, 216, 217 to lay flat 220. The force needed to cause the foils or strips to lay flat may exceed the yield resistance of the foil or strip material and foil or snip damage may ensue. FIG. 3 demonstrates the result 320 of utilizing the translated downward force realized when placing bent foils or strips 315, 316, 317 across a curved surface, such as, for example, arc 310. Testing shows that relatively small amounts of force are necessary to cause such foils or strips to lay flush against each other with such an arrangement in, for example the embodiment of FIG. 3.

In exemplary embodiments, foils or strips of substrate and mask material may be placed in tension across an arc and then fixed in place to maintain the mask to substrate relationship and the location of the substrate to the holder, for example. A simple constraining mechanism for such an arrangement could be a bar across each end of the foils or strips that is constrained by a bolt into the body of an arc-shaped holder. Alternatively, one end of the foils or strips of substrate and mask material may be pinned, clamped, or otherwise fixed in place, tension may be placed on the material from the second end, and while holding that tension the second end may be pinned, clamped or otherwise fixed in place. When fixed in place this pinning or clamping mechanism now maintains the tension on the foils or strips and the external tensioning source may be removed. This simple method may include fixed clamping methods on each end.

Different materials expand at different rates at different applied temperatures. For instance, typical vacuum deposition processes produce heat in the materials that receive coating. Both the masks and the substrate may be coated in such a process. This resulting temperature change may thus cause non-uniform thermal expansion of the masks relative to the substrates, relative to each other, and/or relative to the holder. Differences in thermal expansion between the materials may also cause surfaces to separate from each other, often resulting in bleeding of the coating beneath the masks. To avoid this issue, an exemplary embodiment may place each foil or strip independently in tension such that the variation in foil or strip length, with thermal expansion, could be accommodated by movement in the tensioning device. There are conceivably many ways to apply the necessary tangential force to these strips of material.

Some examples of tensioning methods are demonstrated in FIGS. 4A to 9C. The approaches in FIGS. 8A and 8B differ somewhat from the approaches shown in FIGS. 4A to 7C and 9A to 9C because a simple block of memory material, such as rubber, may be used rather than, for example, a metal spring or other tension generating device. Although the examples shown in FIGS. 4A to 9C show a slot and pin arrangement as a way to engage the tensioning device to the strip of materials that is to be placed in tension, clamping, joining, bonding and other ways could be utilized as well.

Figure 4A:
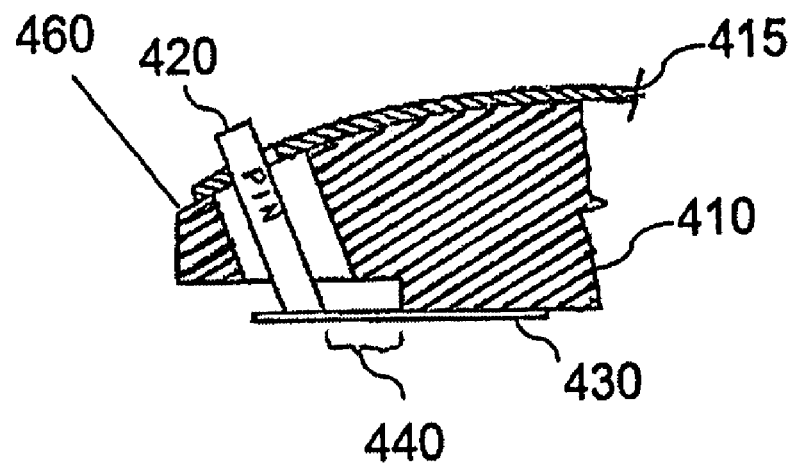
FIGS. 4A and 4B are cross-sectional views of embodiments of the present invention wherein a fiat leaf spring and a bent leaf spring, respectively, are used to secure the substrate and flexible sheets to a curved surface.

FIG. 4A is a cross-sectional view of one embodiment of the present invention wherein a flat leaf spring 430 is fixed to a holder 410 having a curved surface 460 such that a spring force 440 loads a pin 420 to secure the substrate and flexible sheets 415 to a holder 410 having a curved surface 460.

Figure 4B:
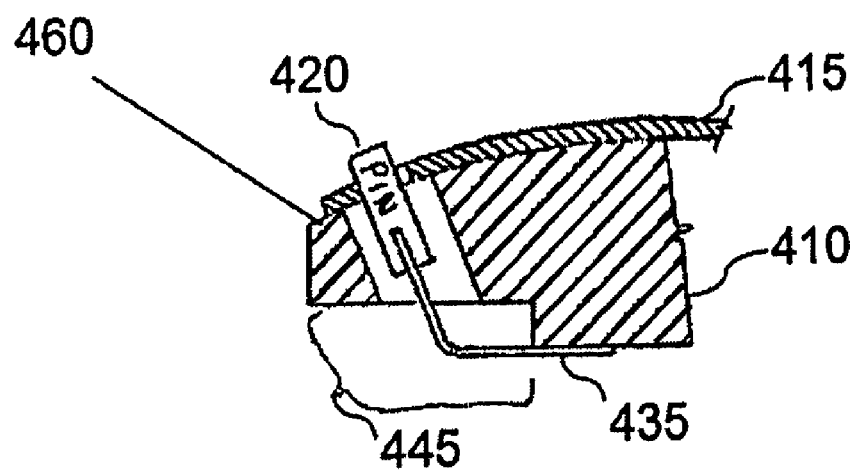

FIG. 4B is a cross-sectional view of one embodiment of the present invention wherein a bent leaf spring 435 is fixed to a holder 410 having a curved surface 460 such that a spring force 445 loads a pin 420 to secure the substrate and flexible sheets 415 to holder 410 having a curved surface 460.

Figure 5A:
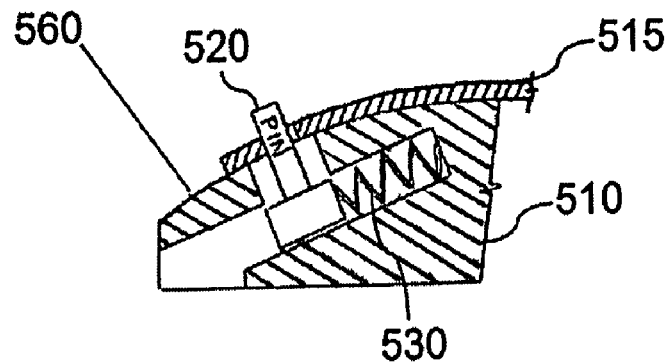
FIGS. 5A and 5B are cross-sectional views of embodiments of the present invention wherein a coil spring loaded pin and a formed and/or bent leaf spring, respectively, are used to secure the substrate and flexible sheets to a curved surface. The formed and/or bent leaf spring is shown in FIG. 5C.

FIG. 5A is a cross-sectional view of one embodiment of the present invention wherein a coil spring 530 loads a pin 520 to secure the substrate and flexible sheets 515 to a holder 510 having a curved surface 560.

Figure 5B:
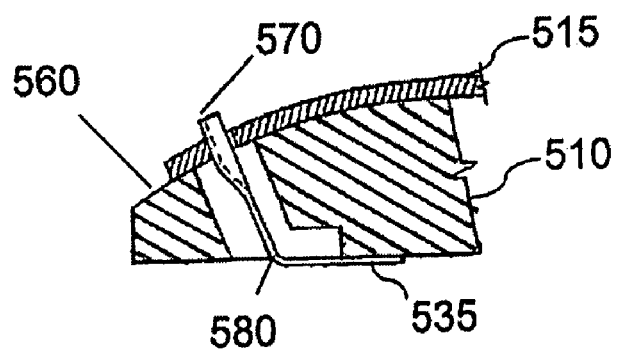

FIG. 5B is a cross-sectional view of one embodiment of the present invention wherein a formed 570 and/or bent 580 leaf spring 535 is fixed to a holder 510 having a curved surface 560 such that a spring force loads the formed 570 and/or bent 580 leaf spring 535 to secure the substrate and flexible sheets 515 to a holder 510 having a curved surface 560.

Figure 5C:
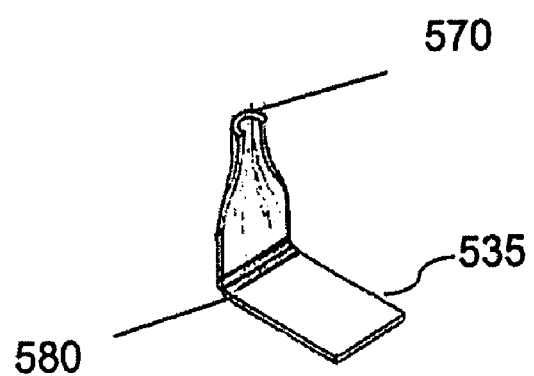

An embodiment of a formed 570 and/or bent 580 leaf spring 535 is depicted in FIG. 5C.

Figure 6A:
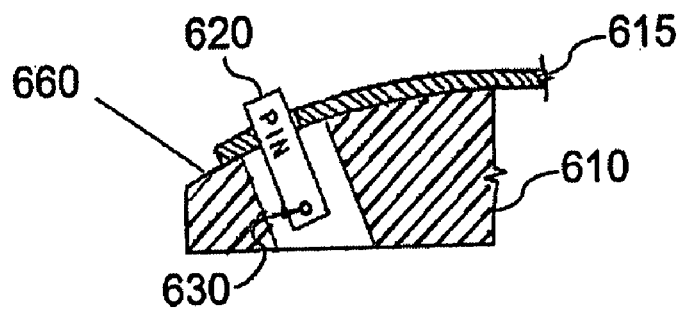
FIG. 6A is a cross-sectional view of an embodiment wherein a torsion spring is used to secure the substrate and flexible sheets to a curved surface.

FIG. 6A is a cross-sectional view of one embodiment of the present invention wherein a torsion spring 630 is fixed to a holder 610 having a curved surface 660 such that a spring force loads a pin 620 to secure the substrate and flexible sheets 615 to a holder 610 having a curved surface 660.

Figure 6B:
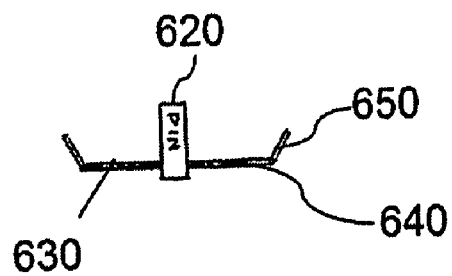
FIGS. 6B and 6C are cross-sectional views of FIG. 6A depicting the ends of the spring which are used to anchor the spring to the curved surface.

FIG. 6B is a cross-sectional view of FIG. 6A depicting bent ends 650 of the spring 630 which are used to anchor the spring 630 to a holder 610 having a curved surface 660 and the lengths 640 of the spring 630 which are put in torsion by the substrate and flexible sheets 615 engaged at the pin 620.

Figure 6C:
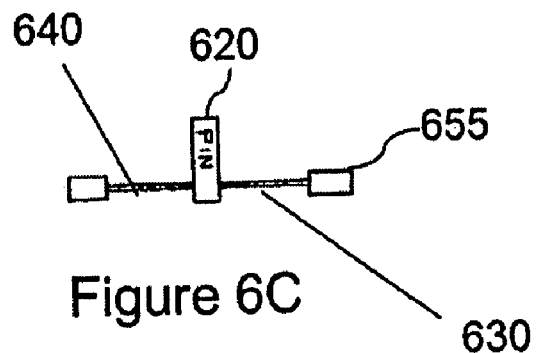

FIG. 6C is a cross-sectional view of FIG. 6A depicting block ends 655 of the spring 630 which are used to anchor the spring 630 to a holder 610 having a curved surface 660 and the lengths 640 of the spring 630 which are put in torsion by the substrate and flexible sheets 615 engaged at the pin 620.

Figure 7A:
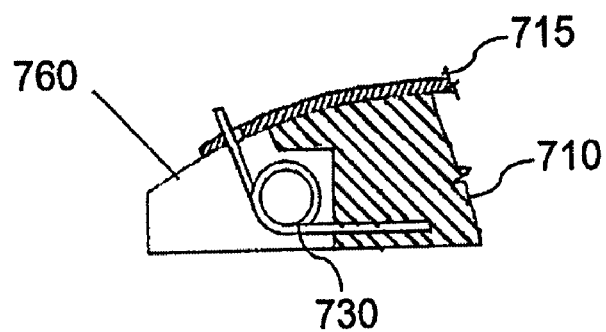
FIGS. 7A depicts a cross-sectional view of an embodiment wherein a conventional torsion spring is used to secure the substrate and flexible sheets to a curved surface.

FIG. 7A is a cross-sectional view of one embodiment of the present invention wherein a conventional torsion spring 730 is loaded to secure the substrate and flexible sheets 715 to a holder 710 having a curved surface 760.

Figure 7B:
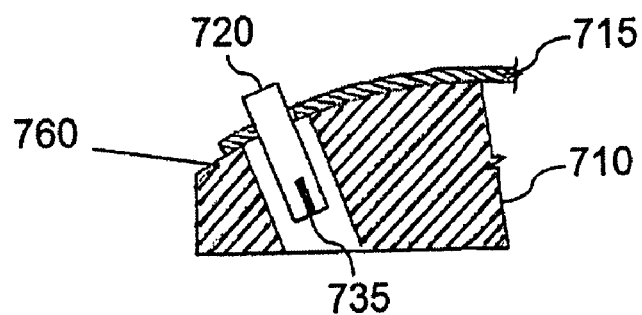
FIGS. 7B and 7C illustrate embodiments of a rectangular torsion spring that is used to create tension in the substrate and flexible sheets. The rectangular torsion spring is shown in FIG. 7C in greater detail that reveals its wing-type design.

FIG. 7B is a cross-sectional view of one embodiment of the present invention wherein a rectangular torsion spring 735 loads a pin 720 to create tension in the substrate and flexible sheets 715 to secure them to a holder 710 having a curved surface 760.

Figure 7C:
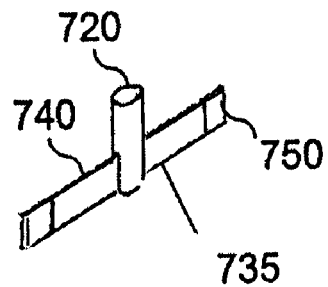

FIG. 7C reveals the wing-type design of the torsion spring of FIG. 7B depicting spring ends 750 of the spring 735 which are used to anchor the spring 735 to a holder 710 having a curved surface 760 and the lengths 740 of the spring 735 which are put in torsion by the substrate and flexible sheets 715 engaged at the pin 720.

Figure 8A:
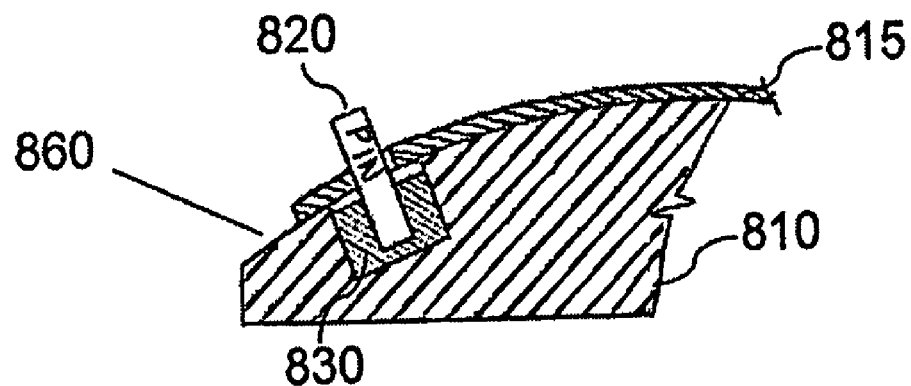
FIGS. 8A and 8B depict the use of an elastic material as an embodiment of a spring.

FIG. 8A is a cross-sectional view of one embodiment of the present invention wherein an elastic material 830 is embedded in the top of a holder 810 with a curved surface 860 such that a spring force loads the pin 820 to secure the substrate and flexible sheets 815 to a holder 810 having a curved surface 860.

Figure 8B:
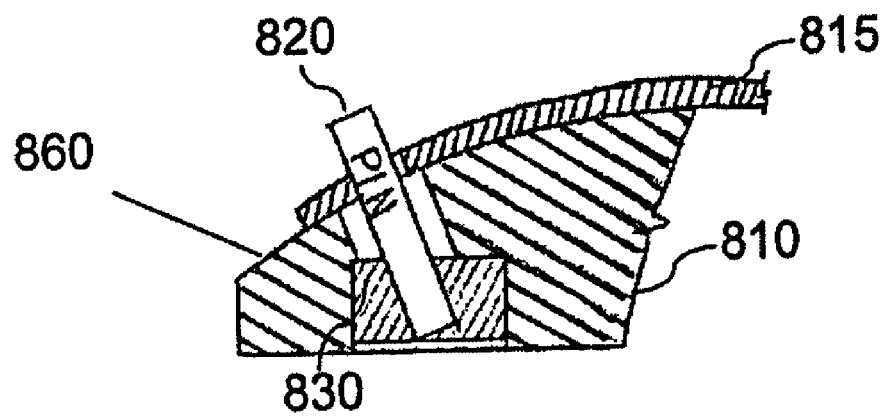

FIG. 8B is a cross-sectional view of one embodiment of the present invention wherein an elastic material 830 is embedded in the bottom of a holder 810 having a curved surface 860 such that a spring force loads the pin 820 to secure the substrate and flexible sheets 815 to a holder 810 having a curved surface 860.

Figure 9A:
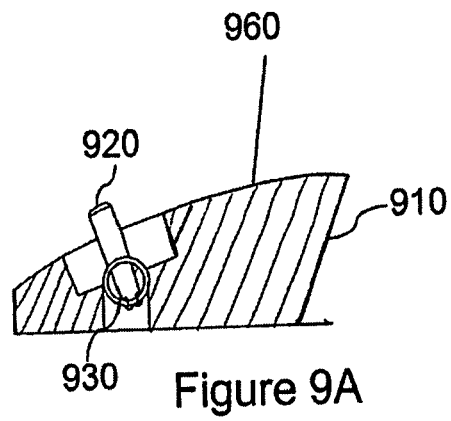
FIG. 9A depicts the use of an embodiment of a tubular spring.

FIG. 9A is a cross-sectional view of one embodiment of the present invention wherein a tubular spring element 930 is fastened to a pin 920 to secure the substrate and flexible sheets to a holder 910 with a curved surface 960.

Figure 9B:
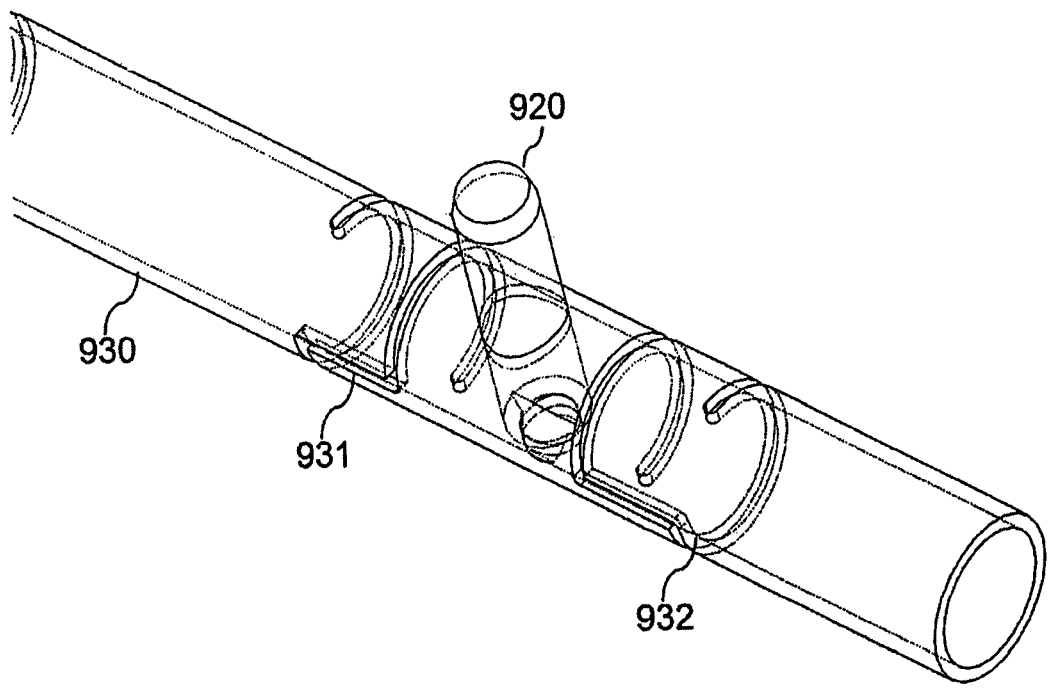
FIG. 9B depicts an embodiment of a tubular spring.

FIG. 9B reveals the cut-away portions 931, 932 of the tubular spring 930 of FIG. 9A and the pin 920 which may be welded, soldered, brazed, pressed, in or peened to the tube.

Figure 9C:
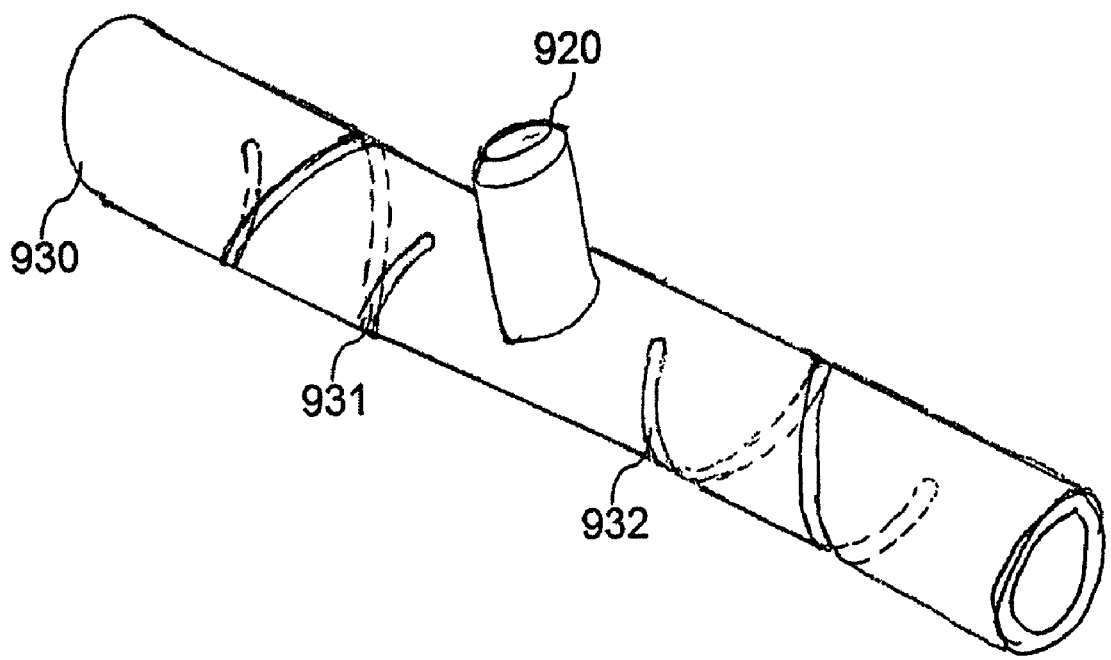
FIG. 9C is a further embodiment wherein the tubular spring element is helical in shape.

FIG. 9C is a further embodiment which reveals a helical cut-away 931, 932 design of the tubular spring element 930 of FIG. 9A and the pin 920 which may be welded, soldered, brazed, pressed in or peened to the tube.

In particular, although the examples shown in FIGS. 4A to 7C and 9A to 9C show a spring pin arrangement to keep the strip of materials in tension over the curved surface of the substrate, an off-axis roll-down bar could be utilized as well, for example.

The presented embodiment of a masking approach enables the use of less expensive masking materials. For example, thin foils or strips of raw material are typically cheaper to procure and less time consuming and labor intensive to convert to the necessary mask openings than machining thicker blocks of the same material. Also, thin foils or strips lend themselves to more cost-effective forms of conversion like laser and water jet cutting, etching, die-cutting, shearing and stamping.

With the bottom surface of a substrate foil or strip held uniformly against an arc-shaped holder, the resulting conductive cooling in a typical vacuum deposition process may be more uniform than with a flat holder. This exemplary process facilitates consistent film growth, deposition rates and properties across the entire coating area, and thus more consistent battery product performance.

Without departing from the spirit and scope of this invention, one of ordinary skill in the art can make various changes and modifications to the method and apparatus of the present invention to adapt it to various usages and conditions. For instance, although the above describes exemplary methods and apparatuses for masking a flexible battery, it is to be understood that the present invention can be used in a variety of applications, such as thin film electronic devices, and non electrical devices, such as used for graphical design. Additionally, device substrates need not be flexed to produce the curved surface. For example, a device substrate to which a mask is applied can be curved by design and manufacture. As such, these and other changes and modifications are properly, equitably, and intended to be, within the full range of equivalents of the following claims.

What is claimed is:

1. A method for masking a substrate, comprising:
   flexing at least one substrate to provide a curved substrate surface; and
   providing at least one flexible sheet on said curved surface;
   fixing said at least one flexible sheet to place said at least one flexible sheet in tension; and
   applying a force to said at least one flexible sheet in a direction substantially tangential to said curved surface.

2. The method of claim 1, wherein said substrate comprises a foil or a strip.

3. The method of claim 1, further comprising providing said curved surface in the form of an arc.

4. The method of claim 1, wherein said flexible sheet comprises a foil or strip.

5. The method of claim 1, further comprising placing said at least one substrate in tension.

6. The method of claim 1, further wherein applying comprises using a mechanism selected from the group consisting of a spring pin and an off-axis roll-down bar.

7. The method of claim 5, further comprising applying a force to said at least one substrate in a direction substantially tangential to the curved surface.

8. The method of claim 7, further comprising using a mechanism selected from the group consisting of a spring pin and an off-axis roll-down bar.

9. The method of claim 1, further comprising creating tension by applying torque to said at least one substrate.

10. The method of claim 1, further comprising applying a torque to said at least one sheet.

11. The method of claim 1, wherein said at least one flexible sheet comprises a mask.

12. A method for masking a substrate, comprising:
providing at least one substrate;
providing at least one flexible sheet on said at least one substrate; and
creating tension in said at least one flexible sheet or said at least one substrate to form a surface of said flexible sheet or said substrate into a curved shape; and
applying force to said at least one flexible sheet or said at least one substrate in a direction substantially tangential to said surface of said at least one flexible sheet or said substrate.

13. The method of claim 12, wherein said substrate comprises a foil or a strip.

14. The method of claim 12, further comprising providing said curved shape in the form of an arc.

15. The method of claim 12, wherein said flexible sheet comprises a foil or a strip.

16. The method of claim 12, further comprising applying a torque to the at least one substrate.

17. The method of claim 16, wherein applying comprises further using a mechanism selected from the group consisting of a spring pin and an off-axis roll-down bar.

18. The method of claim 12, wherein said at least one flexible sheet comprises a mask.

* * * * *